US010250216B2

(12) United States Patent
Kumar et al.

(10) Patent No.: US 10,250,216 B2
(45) Date of Patent: Apr. 2, 2019

(54) MULTISTAGE MATCHING NETWORK AND RELATED TECHNIQUES

(71) Applicant: The Regents of the University of Colorado, a body corporate, Denver, CO (US)

(72) Inventors: Ashish Kumar, Boulder, CO (US); Sreyam Sinha, Boulder, CO (US); Khurram K. Afridi, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 79 days.

(21) Appl. No.: 15/633,526

(22) Filed: Jun. 26, 2017

(65) Prior Publication Data

US 2017/0373662 A1    Dec. 28, 2017

Related U.S. Application Data

(60) Provisional application No. 62/354,796, filed on Jun. 26, 2016, provisional application No. 62/450,495, filed on Jan. 25, 2017.

(51) Int. Cl.
| | | |
|---|---|---|
| *H03H 7/38* | (2006.01) | |
| *H03H 7/40* | (2006.01) | |
| *H02J 50/05* | (2016.01) | |
| *H02J 50/10* | (2016.01) | |

(52) U.S. Cl.
CPC ............ *H03H 7/40* (2013.01); *H02J 50/05* (2016.02); *H02J 50/10* (2016.02); *H03H 7/38* (2013.01); *H03H 2260/00* (2013.01)

(58) Field of Classification Search
CPC .... H03H 7/38; H03H 7/383; H03H 2007/386; H03H 2260/00
USPC ...................................................... 333/32, 33
See application file for complete search history.

(56) References Cited

U.S. PATENT DOCUMENTS

| | | | | |
|---|---|---|---|---|
| 8,890,638 B2* | 11/2014 | Singh | ............... | H01L 23/66 |
| | | | | 333/32 |
| 2013/0249650 A1* | 9/2013 | Bianchi | ............... | H03H 7/0123 |
| | | | | 333/202 |
| 2015/0229289 A1* | 8/2015 | Suzuki | ............... | H02J 50/80 |
| | | | | 333/17.3 |

* cited by examiner

*Primary Examiner* — Stephen E. Jones
(74) *Attorney, Agent, or Firm* — FisherBroyles, LLP; Thomas J. Osborne, Jr.

(57) ABSTRACT

Multistage matching networks and analytical frameworks for improving and/or optimizing the networks is provided. In one example, a framework relaxes the resistive constraint on the input and load impedances of the stages of a multistage matching network and allows them to be complex. Based on this framework, the design of multistage matching networks can be improved or optimized, such as using a method of Lagrange multipliers. A design optimization approach, for example, can be used to predict an optimum distribution of gains and impedance characteristics among the stages of a multistage matching network. The efficiency of matching networks designed using this example approach is compared with a conventional design approach, and it is shown that significant efficiency improvements are possible.

20 Claims, 25 Drawing Sheets

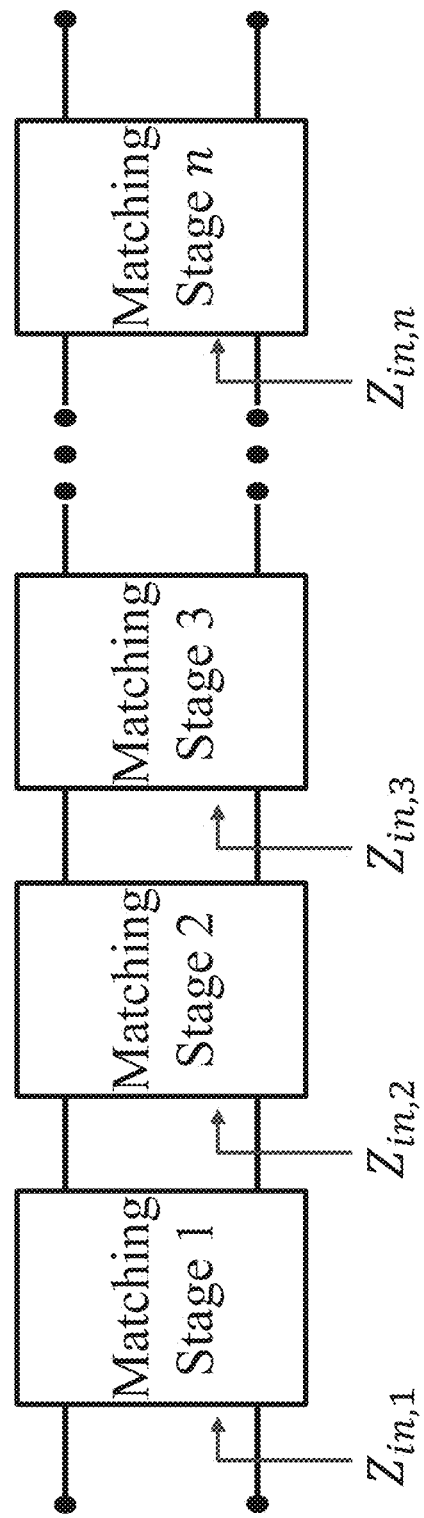

TABLE III. EXPRESSIONS FOR OPTIMAL EQUAL CURRENT GAIN $G_{Leq}$ FOR UP TO FOUR-STAGE MATCHING NETWORKS

| Number of Stages | Expressions for $G_{Leq}$ |
|---|---|
| $n = 2$ | $\dfrac{G_{L,tot}\left(\sqrt{G_{L,tot}^2 + 4} + G_{L,tot}\right)}{2}$ |
| $n = 3$ | $\sqrt{\dfrac{\left(9G_{L,tot}^2 + \sqrt{3}\sqrt{27G_{L,tot}^4 - 4G_{L,tot}^6}\right)^{1/3}}{2^{1/3}3^{2/3}} + \dfrac{\left(\frac{2}{3}\right)^{1/3} G_{L,tot}^2}{\left(9G_{L,tot}^2 + \sqrt{3}\sqrt{27G_{L,tot}^4 - 4G_{L,tot}^6}\right)^{1/3}}}$ |
| $n = 4$ | $\dfrac{1}{2}\sqrt{\dfrac{\left(9G_{L,tot}^4 + \sqrt{3}\sqrt{256G_{L,tot}^6 + 27G_{L,tot}^8}\right)^{1/3}}{2^{1/3}3^{2/3}} + \dfrac{4\left(\frac{2}{3}\right)^{1/3} G_{L,tot}^2}{\left(9G_{L,tot}^4 + \sqrt{3}\sqrt{256G_{L,tot}^6 + 27G_{L,tot}^8}\right)^{1/3}}} + \dfrac{1}{2}\sqrt{2G_{L,tot}^2 - \dfrac{\left(9G_{L,tot}^4 + \sqrt{3}\sqrt{256G_{L,tot}^6 + 27G_{L,tot}^8}\right)^{1/3}}{2^{1/3}3^{2/3}} + \dfrac{4\left(\frac{2}{3}\right)^{1/3} G_{L,tot}^2}{\left(9G_{L,tot}^4 + \sqrt{3}\sqrt{256G_{L,tot}^6 + 27G_{L,tot}^8}\right)^{1/3}}}$ |

FIG. 13

| Multistage L-section Network | Range of Total Current Gain $G_{i,tot}$ | Optimal Design Relationships | Summary of Optimization Results |
|---|---|---|---|
| Fig. 2(a) and 2(b) ($G_{i,tot} \leq 1$) | $0 < G_{i,tot} \leq \frac{1}{\sqrt{2}}$ | $G_{i,1} = G_{i,2} = \cdots = G_{i,n-1} \stackrel{\text{def}}{=} G_{i,eq}$, $G_{i,n} = \frac{G_{i,tot}}{G_{i,eq}^{n-1}}$, $\frac{G_{i,eq}^{2(n-1)}}{G_{i,tot}\sqrt{G_{i,eq}^{2(n-1)} - G_{i,tot}^2}} = G_{i,eq} + \frac{1}{G_{i,eq}}$. Fig. 2(a): $Q_{in,k} = -G_{i,k-1} \forall k \in \{2,3,\ldots,n\}$, Fig. 2(b): $Q_{in,k} = G_{i,k-1} \forall k \in \{2,3,\ldots,n\}$. | • Current gains of first $n-1$ stages are equal.<br>• Fig. 2(a): All stages except first have complex (capacitive) input impedances.<br>• Fig. 2(b): All stages except first have complex (inductive) input impedances.<br>• Optimal efficiency increases with number of stages, asymptotically converging, as $n \to \infty$, to: $\eta_{max} = 1 - \frac{1 - \ln(2G_{i,tot}^2)}{Q_L}$. |
| | $\frac{1}{\sqrt{2}} \leq G_{i,tot} \leq 1$ | $G_{i,1} = G_{i,2} = \cdots = G_{i,n-1} = 1$, $G_{i,n} = G_{i,tot}$. | Single-stage designs have highest efficiency, given by: $\eta_{single} = 1 - \frac{\frac{1}{G_{i,tot}}\sqrt{1-G_{i,tot}^2}}{Q_L}$. |
| Fig. 2(c) and 2(d) ($G_{i,tot} \geq 1$) | $1 \leq G_{i,tot} \leq \sqrt{2}$ | $G_{i,2} = G_{i,3} = \cdots = G_{i,n} = 1$, $G_{i,1} = G_{i,tot}$. | Single-stage designs have highest efficiency, given by: $\eta_{single} = 1 - \frac{G_{i,tot}\sqrt{1-\frac{1}{G_{i,tot}^2}}}{Q_L}$. |
| | $G_{i,tot} \geq \sqrt{2}$ | $G_{i,2} = G_{i,3} = \cdots = G_{i,n} \stackrel{\text{def}}{=} G_{i,eq}$, $G_{i,1} = \frac{G_{i,tot}}{G_{i,eq}^{n-1}}$, $\frac{G_{i,tot}^2}{G_{i,eq}^{(n-1)}\sqrt{G_{i,tot}^2 - G_{i,eq}^{2(n-1)}}} = G_{i,eq} + \frac{1}{G_{i,eq}}$. Fig. 2(c): $Q_{in,k} = \frac{1}{G_{i,k}} \forall k \in \{2,3,\ldots,n\}$, Fig. 2(d): $Q_{in,k} = -\frac{1}{G_{i,k}} \forall k \in \{2,3,\ldots,n\}$. | • Current gains of all but first stage are equal.<br>• Fig. 2(c): All stages except first have complex (inductive) input impedances.<br>• Fig. 2(d): All stages except first have complex (capacitive) input impedances.<br>• Optimal efficiency increases with number of stages, asymptotically converging, as $n \to \infty$, to: $\eta_{max} = 1 - \frac{1 + \ln\left(\frac{G_{i,tot}^2}{2}\right)}{Q_L}$. |

TABLE IV. DESIGN OPTIMIZATION RESULTS FOR THE MULTISTAGE MATCHING NETWORKS OF FIG. 2

FIG. 14

MULTISTAGE MATCHING NETWORK AND RELATED TECHNIQUES

CROSS-REFERENCE TO RELATED APPLICATIONS

This application claims the benefit of U.S. provisional application No. 62/354,796, filed Jun. 26, 2016 entitled "Hybrid Feedforward Control, Efficient Matching Networks and Combinations Thereof" and U.S. provisional patent application No. 62/450,495 filed on Jan. 25, 2017 entitled "Wireless Power Transfer, Matching Networks and Related Techniques," each of which is hereby incorporated by reference as though fully set forth herein.

GOVERNMENT LICENSE RIGHTS

This invention was made with government support under DE-AR0000618 awarded by the U.S. Department of Energy and NSF-1554293 awarded by the U.S. National Science Foundation. The government has certain rights in the invention.

BACKGROUND a. Field

The present disclosure relates to multistage matching networks.

b. Background

Applications such as large conversion ratio power converters and wireless power transfer often require circuit stages that provide voltage or current gains. Transformers can work as broadband gain stages with the added benefit of isolation. However, designing high-efficiency transformers at high frequencies, as required in radio-frequency converters and wireless power transfer applications, is challenging. In applications where isolation is not required and the switching frequency is relatively narrowband, matching networks are typically a more efficient alternative. For a given required gain, using multistage matching networks may be a more efficient solution than a single-stage network. Expressions have been derived for the optimum number of stages and the maximum efficiency achievable in such a multistage matching network. These design approaches have been of significant practical interest; however, these approaches constrain the input and load impedances of each stage of a multistage matching network to be purely resistive.

BRIEF SUMMARY

A new analytical framework for improvement and/or optimization of high-efficiency matching networks is provided. This framework relaxes the resistive constraint on the input and load impedances of the stages of a multistage matching network and allows them to be complex. Based on this framework, the design of multistage matching networks can be improved or optimized, such as using a method of Lagrange multipliers. A design optimization approach, for example, can be used to predict an optimum distribution of gains and impedance characteristics among the stages of a multistage matching network. The efficiency of matching networks designed using this example approach is compared with a conventional design approach, and it is shown that significant efficiency improvements are possible. These improvements are validated through extensive simulations as well as experiments.

Multistage matching networks are often utilized to provide voltage or current gains in resonant conversion applications, such as large conversion ratio power converters and wireless power transfer. In a conventional approach, each stage of a multistage matching network is designed to have a purely resistive input impedance and assumed to be loaded by a purely resistive load. An improved design optimization approach is provided for multistage matching networks comprising stages with reactive components, such as L-section stages, T stages and/or H stages. This approach explores the possibility of improvement in efficiency of the network by allowing the L-section stages to have complex input and load impedances. A new analytical framework is developed to determine the effective transformation ratio and efficiency of each stage for the case when input and load impedances may be complex. For example, the method of Lagrange multipliers can be used to determine the gain and impedance characteristics of each stage in the matching network that maximize overall efficiency. Compared with a conventional design approach for multistage matching networks, the present approach achieves higher efficiency, resulting in loss reduction of up to 35% for a three-stage L-section matching network. In addition, theoretical predictions are validated experimentally using a three-stage matching network designed for 1 MHz and 100 W operation.

The foregoing and other aspects, features, details, utilities, and advantages of the present invention will be apparent from reading the following description and claims, and from reviewing the accompanying drawings.

BRIEF DESCRIPTION OF THE DRAWINGS

FIG. 1A depicts a schematic diagram of an example architecture of a multistage matching network, according to one or more embodiments described and shown herein.

FIG. 4($b$) depicts another example graph showing a corresponding multistage network efficiency, according to one or more embodiments described and shown herein.

FIG. 5($b$) depicts a graph showing a loss reduction achievable using one implementation of a multistage matching network over a conventional design for the same total current gain, according to one or more embodiments described and shown herein.

FIG. 13 depicts Table III described in the Specification.

FIG. 14 depicts Table IV described in the Specification.

DETAILED DESCRIPTION

An analytical framework for improvement and/or optimization of high-efficiency matching networks is provided. This framework relaxes the resistive constraint on the input and load impedances of the stages of a multistage matching network and allows them to be complex. Based on this framework, the design of multistage matching networks can be improved or optimized, such as using a method of Lagrange multipliers. A design optimization approach, for example, can be used to predict an optimum distribution of gains and impedance characteristics among the stages of a multistage matching network. The efficiency of matching networks designed using this example approach is compared with a conventional design approach described in Y. Han and D. J. Perreault, "Analysis and Design of High Efficiency Matching Networks," *IEEE Transactions on Power Electronics*, vol. 21, no. 5, pp. 1484-1491, September 2006 (referred to herein as a conventional design approach or a conventional approach); and it is shown that significant efficiency improvements are possible. These improvements are validated through extensive simulations as well as experiments.

Matching Networks with Complex Input and Load Impedances

Figure 1B:
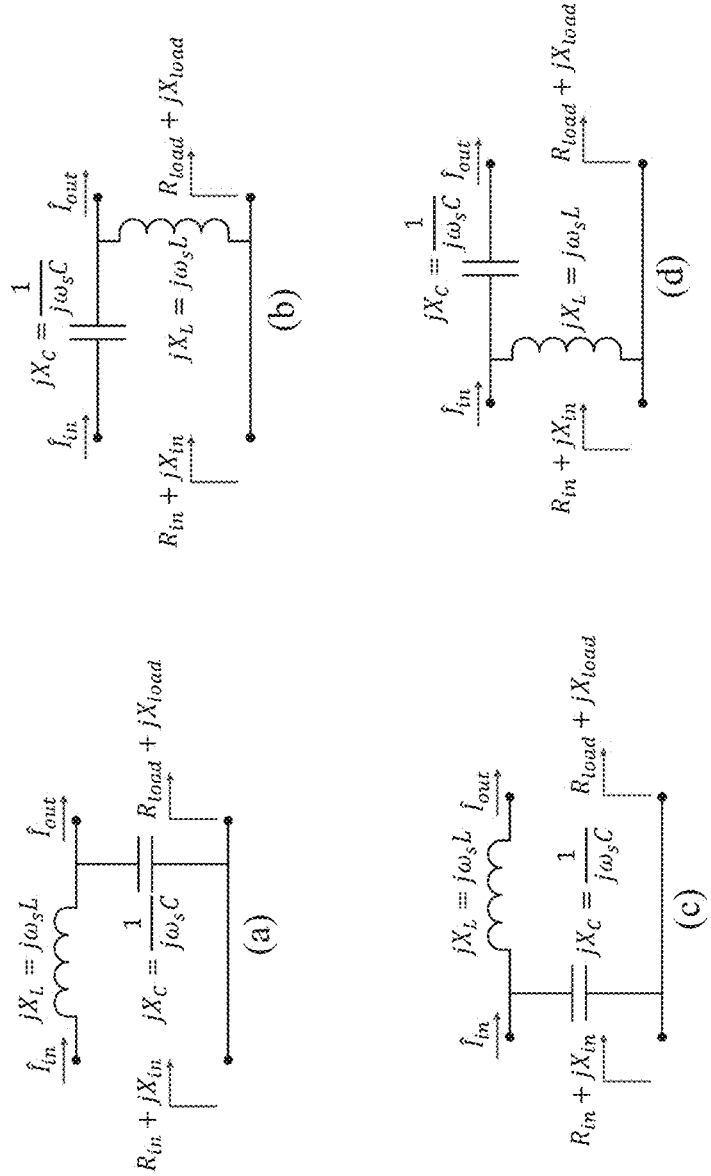
FIG. 1B depicts a schematic diagram of four example L-section matching network stages, according to one or more embodiments described and shown herein.
Figure 2:
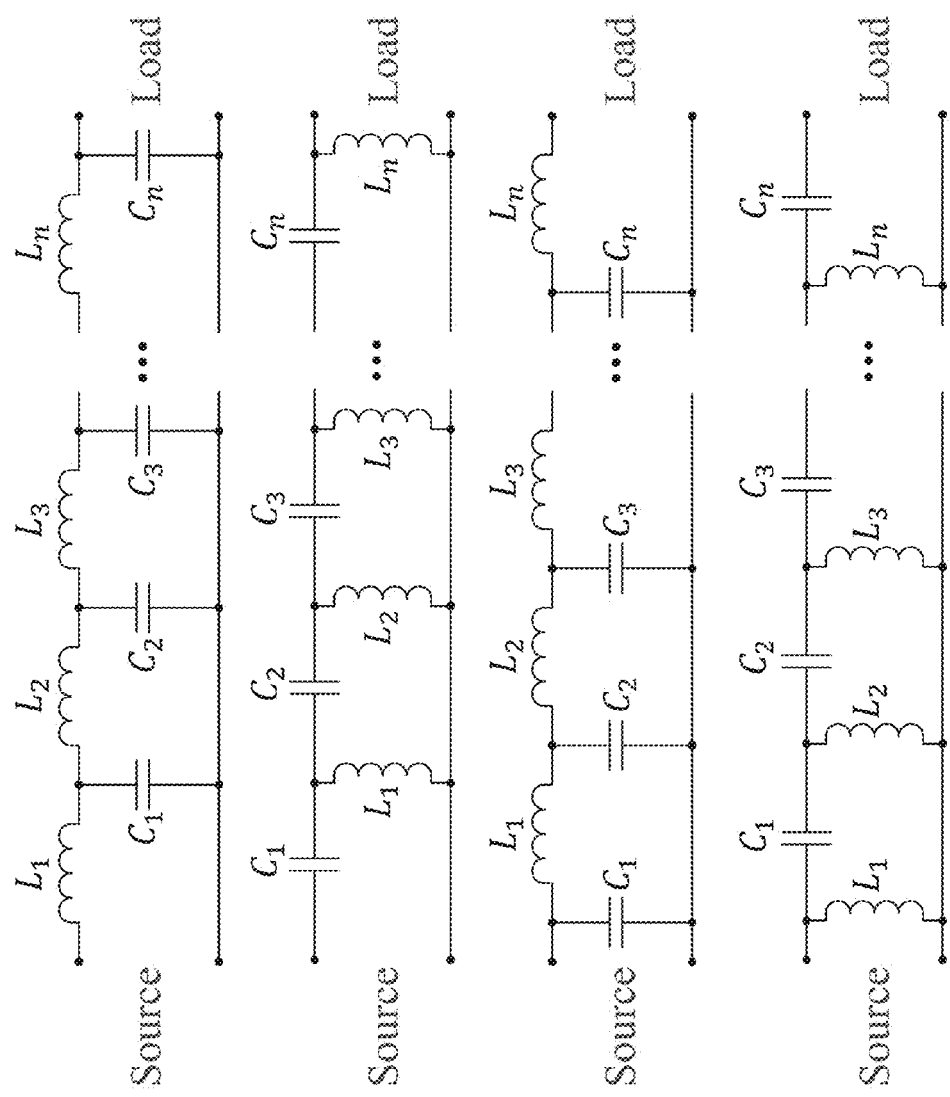
FIG. 2 depicts a schematic diagram of example multistage matching networks constructed by cascading the stages shown in FIG. 1B, according to one or more embodiments described and shown herein.

An example architecture of a multistage matching network is shown in FIG. 1A. Among the basic matching network topologies, L-section matching networks are typically the most efficient for a given gain. Four L-section matching network stages are shown in FIG. 1B, and multistage matching networks constructed by cascading these stages are shown in FIG. 2. Although design approaches are described here in the context of L-section stages, it can also be utilized for T or pi (Π) type stages, as these can be constructed by cascading L-section stages. For instance, the L-section stages of FIGS. 1(a) and 1(c) can be cascaded to form a T stage, and the L-section stages of FIGS. 1(d) and 1(b) can be cascaded to form a pi stage. Typically, multistage L-section matching networks are designed under a "resistive" design framework, wherein each stage has resistive input and load impedances. This framework has been utilized to optimize the design of multistage matching networks. In an example implementation provided herein, however, a new framework for matching network design is provided. This framework relaxes the resistive constraint on the L-section stages of a multistage matching network. Consider a multistage L-section matching network with complex input and load impedances at each stage. To characterize each L-section stage of such a network, we introduce three quantities: $G_i$, which is the current gain provided by the L-section stage, defined as $$G_i = \frac{|\hat{I}_{out}|}{|\hat{I}_{in}|},$$

where $|\hat{I}_{out}|$ and $|\hat{I}_{in}|$ are the amplitudes of the output and input currents of the stage, respectively, as shown in FIG. 1B $Q_{load}$, which is a measure of the load impedance characteristic, defined as $$Q_{load} = \frac{X_{load}}{R_{load}},$$

where $X_{load}$ and $R_{load}$ are the imaginary and real parts of the load impedance, respectively, as shown in FIG. 1B; and $Q_{in}$, which is a measure of the input impedance characteristic, defined as $$Q_{in} = \frac{X_{in}}{R_{in}},$$

where $X_{in}$ and $R_{in}$ are the imaginary and real parts of the input impedance, respectively, also shown in FIG. 1B.

Given values of the current gain $G_i$, the impedance characteristics $Q_{load}$ and $Q_{in}$, and the load resistance $R_{load}$ for an L-section stage, the inductance and capacitance values of that stage can be determined from closed-form expressions by relating the current gain and input impedance of the stage to the reactances in its series and shunt branches, and the load impedance. For instance, for the L-section stage shown in FIG. 1B, circuit (a), the inductance and capacitance values can be determined from:

$$L = \frac{\left(G_i\sqrt{(1-G_i^2)+Q_{load}^2} + G_i^2 Q_{in}\right)R_{load}}{2\pi f_s}, \quad (1a)$$

$$C = \frac{1-G_i^2}{2\pi f_s\left(G_i\sqrt{(1-G_i^2)+Q_{load}^2} - G_i^2 Q_{load}\right)R_{load}}, \quad (1b)$$

Here $f_s$ is the operating frequency. Similar expressions for the other L-section stages shown in FIG. 1B are listed in Table 1. It should be noted that the framework described above reduces to the conventional resistive framework when $Q_{in}$ and $Q_{load}$ of each L-section stage of a multistage matching network are set to zero. This new analytical framework enables a substantially larger design space to be explored for the optimization of multi stage L-section matching networks.

| L-section Stage | Expressions for L and C |
|---|---|
| FIG. 1(a) | $L = \dfrac{\left(G_i\sqrt{(1-G_i^2)+Q_{load}^2} + G_i^2 Q_{in}\right)R_{load}}{2\pi f_s}$ |
|  | $C = \dfrac{1-G_i^2}{2\pi f_s\left(G_i\sqrt{(1-G_i^2)+Q_{load}^2} - G_i^2 Q_{load}\right)R_{load}}$ |
| FIG. 1(b) | $L = \dfrac{\left(G_i\sqrt{(1-G_i^2)+Q_{load}^2} + G_i^2 Q_{load}\right)R_{load}}{2\pi f_s(1-G_i^2)}$ |
|  | $C = \dfrac{1}{2\pi f_s\left(G_i\sqrt{(1-G_i^2)+Q_{load}^2} - G_i^2 Q_{in}\right)R_{load}}$ |
| FIG. 1(c) | $L = \dfrac{\left(\sqrt{(G_i^2-1)+G_i^2 Q_{in}^2} - Q_{load}\right)R_{load}}{2\pi f_s}$ |
|  | $C = \dfrac{1-\dfrac{1}{G_i^2}}{2\pi f_s\left(\sqrt{(G_i^2-1)+G_i^2 Q_{in}^2} + Q_{in}\right)R_{load}}$ |
| FIG. 1(d) | $L = \dfrac{\left(\sqrt{(G_i^2-1)+G_i^2 Q_{in}^2} - Q_{load}\right)R_{load}}{2\pi f_s\left(1-\dfrac{1}{G_i^2}\right)}$ |
|  | $C = \dfrac{1}{2\pi f_s\left(\sqrt{(G_i^2-1)+G_i^2 Q_{in}^2} + Q_{load}\right)R_{load}}$ |

Table I. Expressions for the Inductance and Capacitance of the Four L-Section Stages of FIG. 1

Multistage Matching Network Design Approach

The analytical framework presented above can be used to develop a new approach for the optimization of multistage matching networks. The primary objective of this approach is to determine the optimal distribution of current gains ($G_i$'s) and impedance characteristics ($Q_{in}$'s and $Q_{load}$'s) among the different stages of a multistage matching network in a manner that maximizes its efficiency. The first step in this approach is to express the efficiency of an L-section stage in terms of its current gain and impedance characteristics. The losses in an L-section stage owe their origin to winding and core losses in the inductor, and conduction and dielectric losses in the capacitor. These losses can be represented at the operating frequency by the unloaded quality factors:

$$Q_L = \frac{X_L}{R_L}$$

for the inductor and $$Q_C = \frac{|X_C|}{R_C}$$

for the capacitor, where $X_L = 2\pi f_s L$ and $$X_C = -\frac{1}{2\pi f_s C}$$

are the reactances, and $R_L$ and $R_C$ are the equivalent series resistances of the inductor and the capacitor, respectively. In most cases, losses in the inductor far exceed those in the capacitor, i.e., $Q_C \gg Q_L$. Furthermore, in high-efficiency matching networks, the total losses are low; therefore, capacitor losses can be neglected. In this case, the efficiency of the k-th L-section stage in a multistage matching network can be approximated as:

$$\eta_k \approx 1 - \frac{Q_{eff,k}}{Q_L}. \quad (2)$$

TABLE II

EXPRESSIONS FOR THE EFFECTIVE TRANSFORMATION FACTOR $Q_{eff}$ FOR THE FOUR L-SECTION STAGES OF FIG. 1B

| L-section Stage | Expressions for $Q_{eff}$ |
|---|---|
| FIG. 1(a) | $\dfrac{1}{G_i}\sqrt{(1-G_i^2)+Q_{load}^2} + Q_{in}$ |
| FIG. 1(b) | $\dfrac{1}{G_i}\sqrt{(1-G_i^2)+Q_{load}^2} - Q_{load}$ |
| FIG. 1(c) | $G_i\sqrt{\left(1-\dfrac{1}{G_i^2}\right)+Q_{in}^2} - Q_{load}$ |
| FIG. 1(d) | $G_i\sqrt{\left(1-\dfrac{1}{G_i^2}\right)+Q_{in}^2} + Q_{in}$ |

Here $Q_{eff,k}$ is an effective transformation factor associated with the k-th L-section stage. Its value depends on the type of the L-section stage, and the stage's current gain and impedance characteristics. Expressions for this transformation factor for the four L-section stages of FIG. 1B are listed in Table II. It can be seen from Table II that the effective transformation factor captures the gain as well as the reactance conversion provided by an L-section stage. In the limiting case when both the input impedance characteristic, $Q_{in}$, and the load impedance characteristic, $Q_{load}$, of an L-section stage are zero, the effective transformation factor $Q_{eff}$ quantifies the current gain $G_i$ provided by the stage, and reduces to the quality factor Q of the stage as defined in the conventional design approach. Derivations of the efficiency expression given in (2) for the four L-section stages shown in FIG. 1B are provided in Appendix A below.

Using (2), the efficiency of a multistage matching network with n cascaded L-section stages can be expressed as:

$$\eta_{multistage} \approx \left(1 - \frac{Q_{eff,1}}{Q_L}\right)\left(1 - \frac{Q_{eff,2}}{Q_L}\right)\cdots\left(1 - \frac{Q_{eff,n}}{Q_L}\right), \quad (3)$$

where it is assumed that the inductors of each L-section stage have the same quality factor. Under the high-efficiency assumption (i.e., $Q_{eff,k} \ll Q_L$ $\forall k \in \{1, 2, \ldots, n\}$), the efficiency of the multistage network is well-approximated by:

$$\eta_{multistage} \approx 1 - \frac{\sum_{k=1}^{n} Q_{eff,k}}{Q_L}. \quad (4)$$

The design optimization approach presented here aims to maximize the multistage network efficiency $\eta_{multistage}$ by optimally distributing the gains and impedance characteristics among the L-section stages of the network. It is apparent from the form of (4) that maximizing $\eta_{multistage}$ is equivalent to minimizing the sum of the effective transformation factors of the L-section stages, $\Sigma_{k=1}^{n} Q_{eff,k}$. This minimization problem is constrained by the specification of the total current gain of the multistage matching network, denoted by $G_{i,tot}$. The total current gain is calculated by multiplying the current gains of all the stages of the network. With the source and load positions as indicated in FIGS. 2(a)-2(d), the multistage networks of FIGS. 2(a) and 2(b) are suitable for stepping-up voltage; therefore, the total current gain $G_{i,tot}$ for these networks is constrained to be less than 1. Similarly, the multistage networks of FIGS. 2(c) and 2(d) are suitable for stepping-up current; hence, $G_{i,tot}$ for these networks is constrained to be greater than 1. Additionally, in these examples, the input impedance of the first stage of the multistage matching network is constrained to be near-resistive. This is appropriate for many applications, such as when the multistage matching network is driven by an inverter that requires near-resistive (and slightly inductive) impedance for zero voltage and near-zero current switching. Furthermore, the load impedance of the last stage of the multistage matching network is also constrained to be near-resistive. This is appropriate for applications in which the matching network is loaded by a class-D rectifier, which behaves like a near-resistive (and slightly capacitive) load.

With these constraints, the design optimization problem can be formally expressed as:

$$\min \sum_{k=1}^{n} Q_{eff,k} \quad (5a)$$

subject to:

$$\prod_{k=1}^{n} G_{i,k} = G_{i,tot}, Q_{in,1} = 0, \text{ and } Q_{load,n} = 0. \quad (5b)$$

Here $G_{i,k}$ is the current gain provided by the k-th L-section stage of the multistage network, $Q_{in,1}$ is the input impedance characteristic of the first stage, and $Q_{load,n}$ is the load impedance characteristic of the last (n-th) stage. To solve this optimization problem, the method of Lagrange multipliers is employed, utilizing the following Lagrangian:

$$\mathcal{L} = \Sigma_{k=1}^{n} Q_{eff,k} + \lambda_1(\Pi_{k=1}^{n} G_{i,k} - G_{i,tot}) + \lambda_2 Q_{in,1} + \lambda_3 Q_{load,n}. \quad (6)$$

Here, $\lambda_1$, $\lambda_2$ and $\lambda_3$ are Lagrange multipliers. The first term of the Lagrangian represents the expression to be minimized, while the other terms represent the constraints. The sum of the effective transformation factors of all the L-section stages, $\Sigma_{k=1}^{n} Q_{eff,k}$, is minimized subject to the given constraints by setting the partial derivatives of the Lagrangian with respect to the gain and impedance characteristics of each L-section stage to zero. Noting that the input impedance characteristic of each stage equals the load impedance characteristic of the previous stage, that is, $Q_{in,k} = Q_{load,k-1}$, the following partial differential equations need to be solved:

$$\frac{\partial \mathcal{L}}{\partial G_{i,k}} = 0, \forall k \in \{1, 2, \ldots, n\}, \quad (7)$$

$$\frac{\partial \mathcal{L}}{\partial Q_{in,k}} = 0, \forall k \in \{1, 2, \ldots, n\},$$

$$\frac{\partial \mathcal{L}}{\partial \lambda_i} = 0, \forall i \in \{1, 2, 3\}.$$

Solving (7) results in the distribution of current gains and impedance characteristics that maximize the efficiency of the multistage matching network. The nature of this optimal distribution depends on the type of multistage matching network and the value of the required total current gain. For the multistage network shown in FIG. 2(a), with total current gain $G_{i,tot}$ less than $1/\sqrt{2}$, the optimal current gains $G_i$ of each stage are related as:

$$G_{i,1} = G_{i,2} = \ldots = G_{i,n-1} \stackrel{def}{=} G_{i,eq}, \quad (8a)$$

$$G_{i,n} = \frac{G_{i,tot}}{G_{i,eq}^{n-1}}. \quad (8b)$$

It is evident from (8a) that in the optimized design, the current gains of the first n−1 stages are equal, while the last stage provides the remaining current gain, as given by (8b). This is in contrast to all the stages having equal gains when the stages are constrained to have resistive input and output impedances, as in the conventional design approach. The optimal equal current gain of the first n−1 stages, $G_{i,eq}$ as defined in (8a), can be computed from the following equation:

$$\frac{G_{i,eq}^{2(n-1)}}{G_{i,tot}\sqrt{G_{i,eq}^{2(n-1)} - G_{i,tot}^2}} = G_{i,eq} + \frac{1}{G_{i,eq}}. \quad (9)$$

For up to 4 stages (n≤4), (9) can be solved analytically to obtain closed-form expressions for the optimal equal current gain $G_{i,eq}$. These closed-form expressions are provided in Table III (shown in FIG. 13). For more than four stages, (9) can be solved numerically to obtain the optimal equal current gain $G_{i,eq}$. The optimal impedance characteristics of each stage of the multistage network, $Q_{in}$ and $Q_{load}$, are related to the optimal current gains as:

$$Q_{in,k} = Q_{load,k-1} = -G_{i,k-1} \forall k \in \{2, 3, \ldots, n\} \quad (10)$$

It can be observed from (10) that in the optimized design, the input impedance characteristics, $Q_{in}$ (which is the ratio of the imaginary to the real part of the input impedance), of all stages except the first stage are non-zero, since the current gains $G_i$'s must be non-zero. This indicates that higher efficiencies are achievable when the input impedances of the stages of a multistage matching network are allowed to be complex. Equation (10) also implies that for the multistage network of FIG. 2(a), these input impedances are capacitive (since the current gains $G_i$'s are positive).

Using the design relationships of (8) and (10), the optimal efficiency of the multistage network of FIG. 2(a) can be expressed as:

$$\eta_{multistage,opt} = 1 - \frac{(n-1)\left(\frac{1}{G_{i,eq}} - G_{i,eq}\right) + \frac{1}{G_{i,tot}^2}\left(\frac{G_{i,eq}^{2n-1}}{1 + G_{i,eq}^2}\right)}{Q_L}. \quad (11)$$

Figure 3:
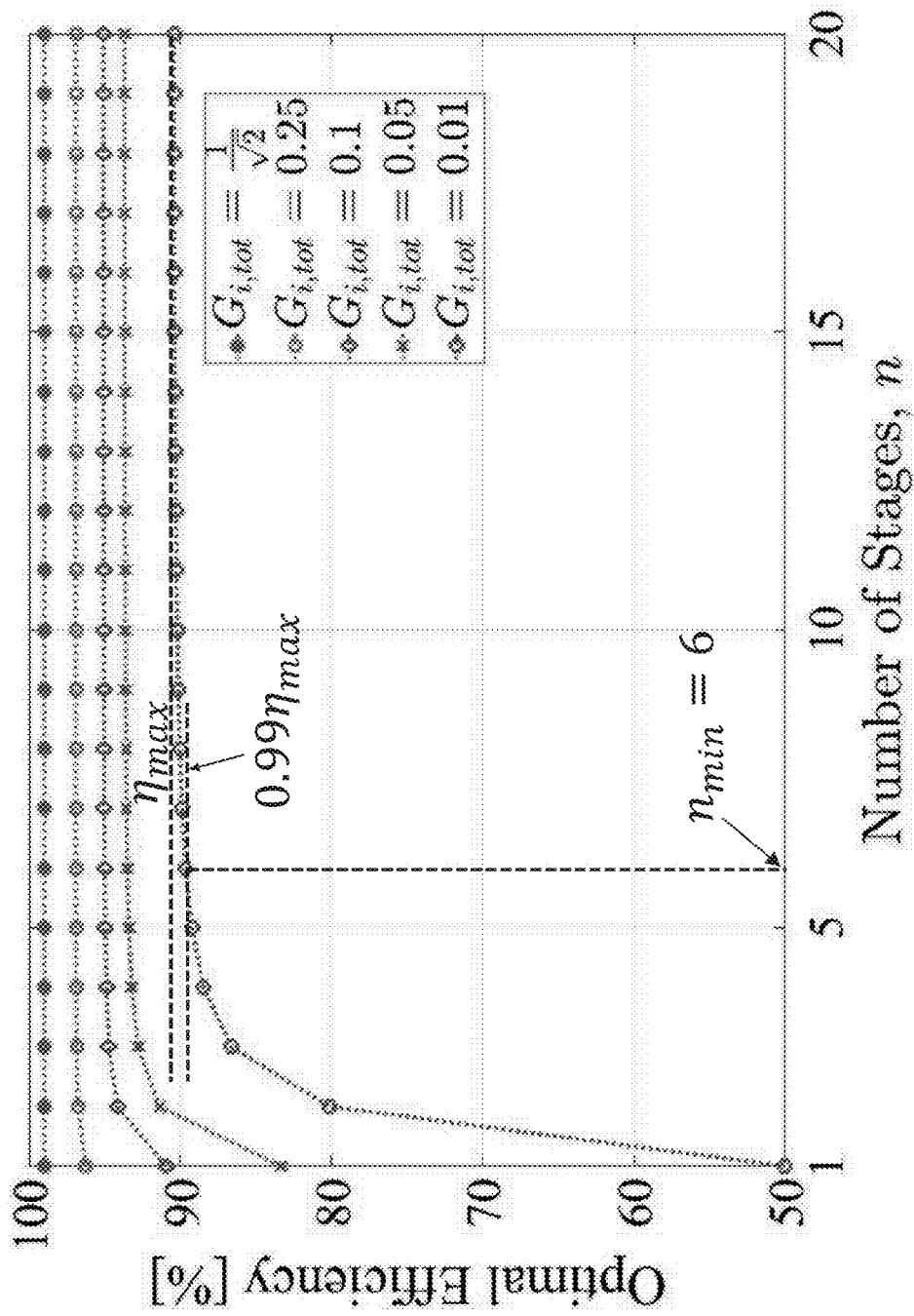
FIG. 3 depicts a graph showing multistage network efficiency plotted as a function of the number of stages for various values of total current gain, according to one or more embodiments described and shown herein.

This optimal multistage network efficiency is plotted as a function of the number of stages n for various values of the total current gain, $$G_{i,tot} \leq \frac{1}{\sqrt{2}},$$

for an inductor quality factor $Q_L$ of 100, in FIG. 3. Note that the efficiencies of single-stage designs (n=1) are also shown in FIG. 3. The single-stage efficiency can be computed using (2) and the expression for the effective transformation factor $Q_{eff}$ of the L-section stage of FIG. 1(a) provided in Table II, setting the stage's current gain $G_i$ equal to the total current gain $G_{i,tot}$, and its impedance characteristics, $Q_{in}$ and $Q_{load}$, both to zero. This results in the following expression for the efficiency of a single-stage network:

$$\eta_{single} = 1 - \frac{\frac{1}{G_{i,tot}}\sqrt{1 - G_{i,tot}^2}}{Q_L}. \quad (12)$$

It can be seen from FIG. 3 that for a given number of stages, the higher the value of the total current gain $G_{i,tot}$, the higher the optimal efficiency. Recalling that the multistage network of FIG. 2(a) is designed for stepping-up voltage ($G_{i,tot} \leq 1$), higher values of total current gain correspond to lower voltage step-up ratios. This validates the intuitive conclusion that multistage matching networks providing lower voltage step-up can be designed more efficiently.

It can also be observed from FIG. 3 that for each value of total current gain $G_{i,tot}$, the optimal efficiency increases monotonically with the number of stages, indicating that for any required total current gain less than $$\frac{1}{\sqrt{2}},$$

higher efficiencies can always be obtained by increasing the number of stages. Furthermore, FIG. 3 shows that as the number of stages increases, the multistage network efficiency asymptotically converges to a maximum value. It can be shown that this asymptotic maximum efficiency is given by:

$$\eta_{max} = \lim_{n \to \infty} \eta_{multistage,opt} = 1 - \frac{1 - \ln(2G_{i,tot}^2)}{Q_L}. \quad (13)$$

This expression, and the corresponding expressions for the other multistage networks of FIG. 2, are derived in Appendix B.

FIG. 3 reveals another useful insight: for each total current gain less than $$\frac{1}{\sqrt{2}},$$

although a greater number of stages results in higher optimal efficiencies, the efficiency improvement diminishes with each additional stage. Therefore, for a given total current gain, adding stages to the multistage network is substantially beneficial only up to a certain number of stages. Furthermore, implementing a multistage network with a very high number of stages may introduce additional power losses due to interconnects, and undesirably increase the overall size of the system. To achieve a sufficiently favorable engineering tradeoff in this scenario, a minimum number of stages $n_{min}$ can be defined, for which the efficiency is higher than a pre-defined fraction of the asymptotic maximum efficiency value given by (13). This can be mathematically expressed as:

$$n_{min} = \min\{n\} \text{ s.t. } \eta_{multistage,opt}|_{n=n_{min}} \geq \alpha_d \eta_{max}. \quad (14)$$

Here, $\alpha_d$ (<1) is a design choice that quantifies how close the multistage network efficiency is to its asymptotic maximum value $\eta_{max}$. The value of $\alpha_d$ is the circuit designer's prerogative and may be decided based on the required total current gain. An example is provided for $G_{i,tot}=0.01$ (corresponding to a voltage step-up ratio, $1/G_{i,tot}$, of 100) in FIG. 3. Assuming an inductor quality factor of 100, the asymptotic maximum efficiency for $G_{i,tot}=0.01$ is about 90.5%. As can be seen from FIG. 3, if $\alpha_d$ is chosen to be 0.99 (that is, the design objective is to achieve efficiencies within 1% of the asymptotic maximum), then the minimum number of stages required is 6. Marginally higher efficiency can be achieved by choosing a higher value of $\alpha_d$, at the cost of using more stages.

Figure 4A:
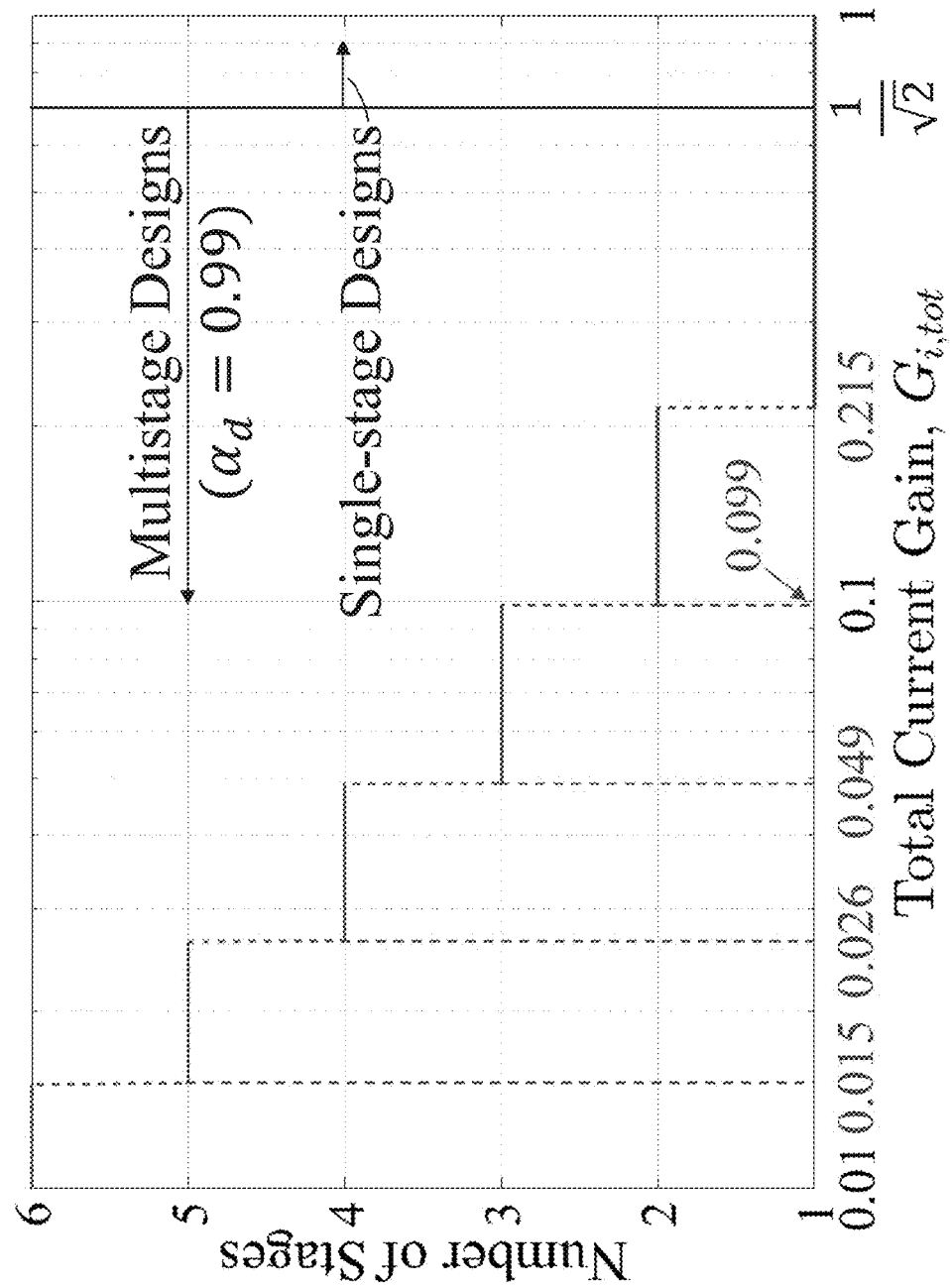
FIG. 4($a$) depicts an example graph showing a minimum number of stages $n_{min}$ required for the same design choice, $\alpha_d$=0.99, as a function of the total current gain $G_{i,tot}$, for an inductor quality factor $Q_L$ of 100, according to one or more embodiments described and shown herein.
Figure 4B:
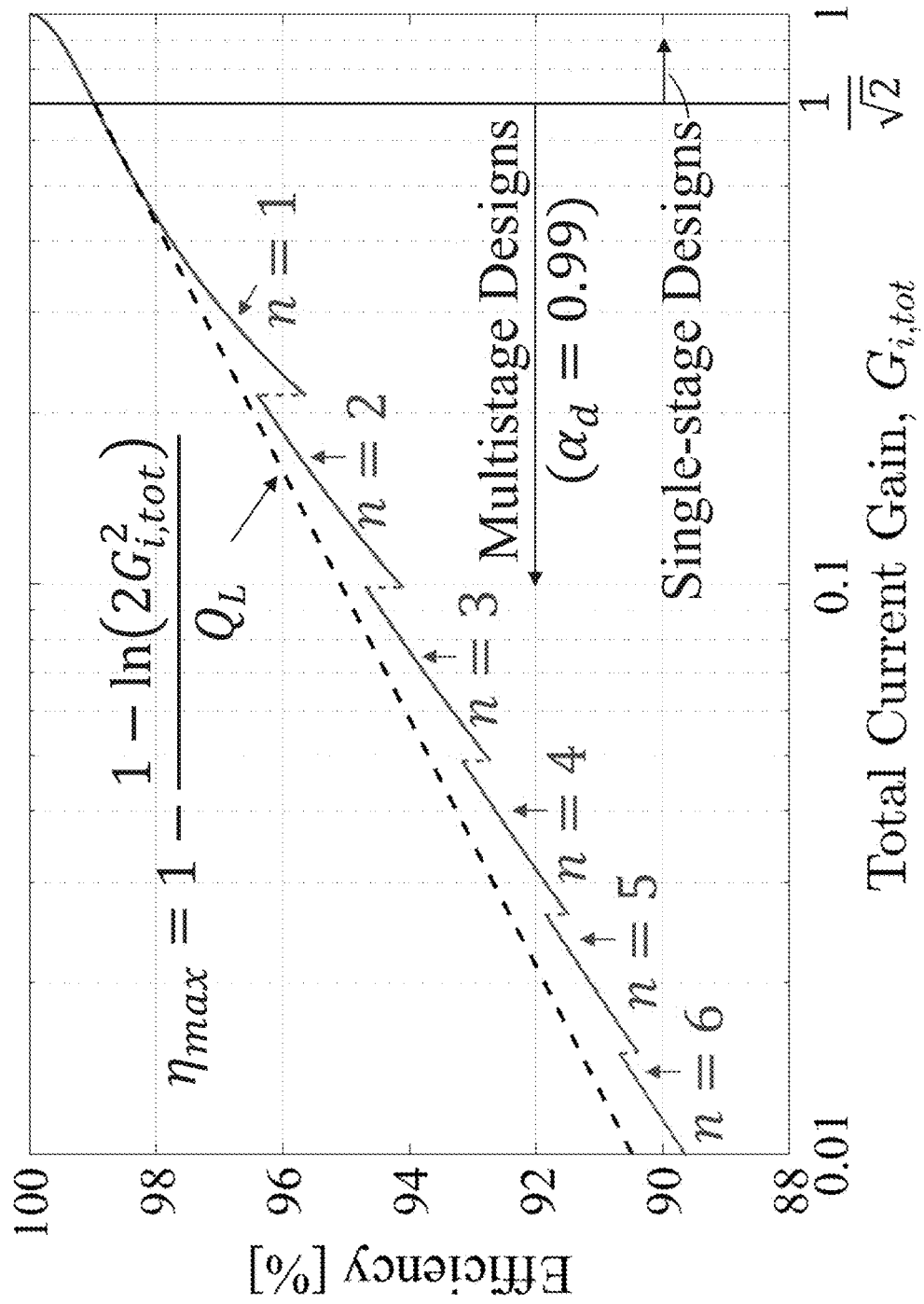

FIG. 4(a) shows the minimum number of stages $n_{min}$ required for the same design choice, $\alpha_d=0.99$, as a function of the total current gain $G_{i,tot}$, for an inductor quality factor $Q_L$ of 100. The corresponding multistage network efficiency is shown in FIG. 4(b), along with the asymptotic maximum efficiency for reference. It can be seen from FIGS. 4(a) and 4(b) that as the total current gain $G_{i,tot}$ increases (that is, the required voltage step-up decreases), a progressively smaller number of stages can achieve efficiencies within 1% of the maximum efficiency.

FIGS. 4(*a*) and 4(*b*) also present the results for total current gains $G_{i,tot}$ greater than $$\frac{1}{\sqrt{2}}.$$

For this range of total current gain, the optimal current gains of each stage of the multistage network of FIG. 2(*a*), determined by solving (7), are related as:

$$G_{i,1}=G_{i,2}= \ldots =G_{i,n-1}=1, \tag{15a}$$

$$G_{i,n}=G_{i,tot}. \tag{15b}$$

It can be seen from (15*a*) that for total current gains greater than $$\frac{1}{\sqrt{2}},$$

the first n−1 stages of a multistage network each provide current gains of 1. Consider the multistage network of FIG. 2(*a*). If an L-section stage in this network provides a current gain of 1, then for an efficiency-optimized network it translates to that stage having zero inductance and zero capacitance, as shown in Appendix C below. Therefore, in the optimized design, the first n−1 stages are eliminated, and the multistage network is reduced to a single-stage network that provides the total current gain $G_{i,tot}$, as given by (15*b*). The results in (15) hold irrespective of the number of stages. Therefore, when the network of FIG. 2(*a*) is designed to provide total current gains greater than $$\frac{1}{\sqrt{2}}$$

(or, voltage step-up ratios less than $\sqrt{2}$), a single-stage design has the highest efficiency. The efficiency of a single-stage design is given by (12), and is also shown in FIG. 4(*b*). It is evident from FIG. 4(*b*) that the single-stage efficiency is a monotonically increasing function of the total current gain $G_{i,tot}$, indicating again that for lower voltage step-up ratios, higher optimal efficiencies are achievable.

For multistage designs, the optimal inductance and capacitance values for the L-section stages can be determined using (1) and (8)-(10). First, (9) can be solved either analytically or numerically (depending on the number of stages n) to obtain the optimal equal current gains of the first n−1 stages, $G_{i,eq}$. Then, (8b) can be used to obtain the current gain of the last stage, $G_{i,n}$. Following this, the impedance characteristics ($Q_{in}$ and $Q_{load}$) of each stage can be computed using (10). Finally, given these current gains and impedance characteristics, the optimal inductance and capacitance values for each stage can be obtained using (1a) and (1b). For single-stage designs, the inductance and capacitance values can be obtained directly using the expressions in Table I, with $G_i=G_{i,tot}$, $Q_{in}=0$ and $Q_{load}=0$.

Relationships similar to (8)-(15) can be obtained for the other three multistage matching networks shown in FIGS. 2(*a*)-2(*d*), enabling similar insights to be drawn. These relationships are summarized for the four different types of multistage networks in Table IV (shown in FIG. 14). The optimal inductance and capacitance values for the networks of FIGS. 2(*b*), (*c*) and (*d*) can be obtained in a manner similar to that described for the network of FIG. 2(*a*) above, using the corresponding design relationships given in Table IV (shown in FIG. 14), and the inductance and capacitance expressions provided in Table I. The above presented optimization approach results in new designs of multistage matching networks, ones that will be shown to compare favorably with conventional designs.

Comparison Between Proposed and Conventional Approaches

Figure 5A:
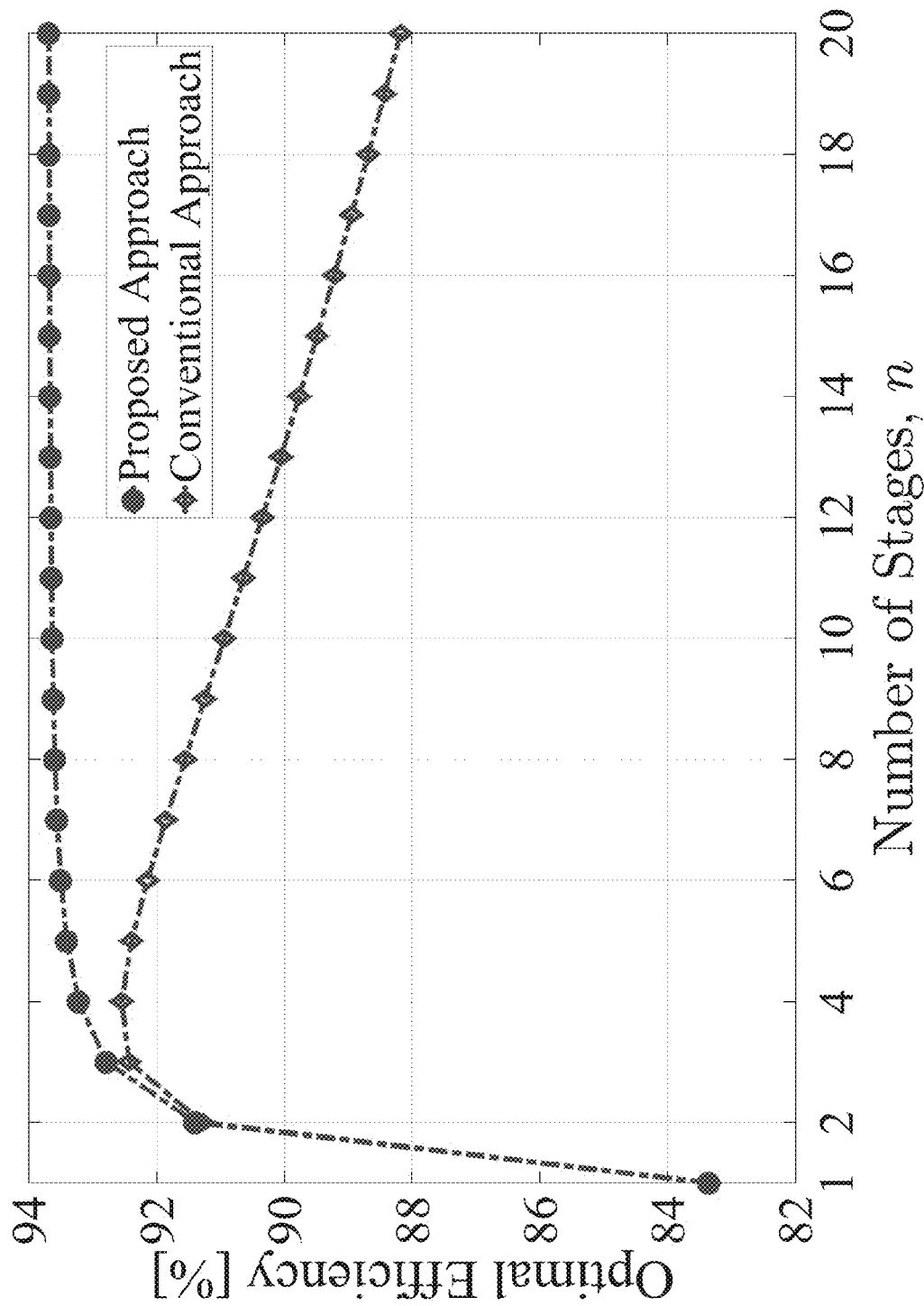
FIG. 5($a$) depicts a graph showing efficiency versus number of stages for the example matching network shown in FIG. 2($a$), according to one or more embodiments described and shown herein.
Figure 5B:
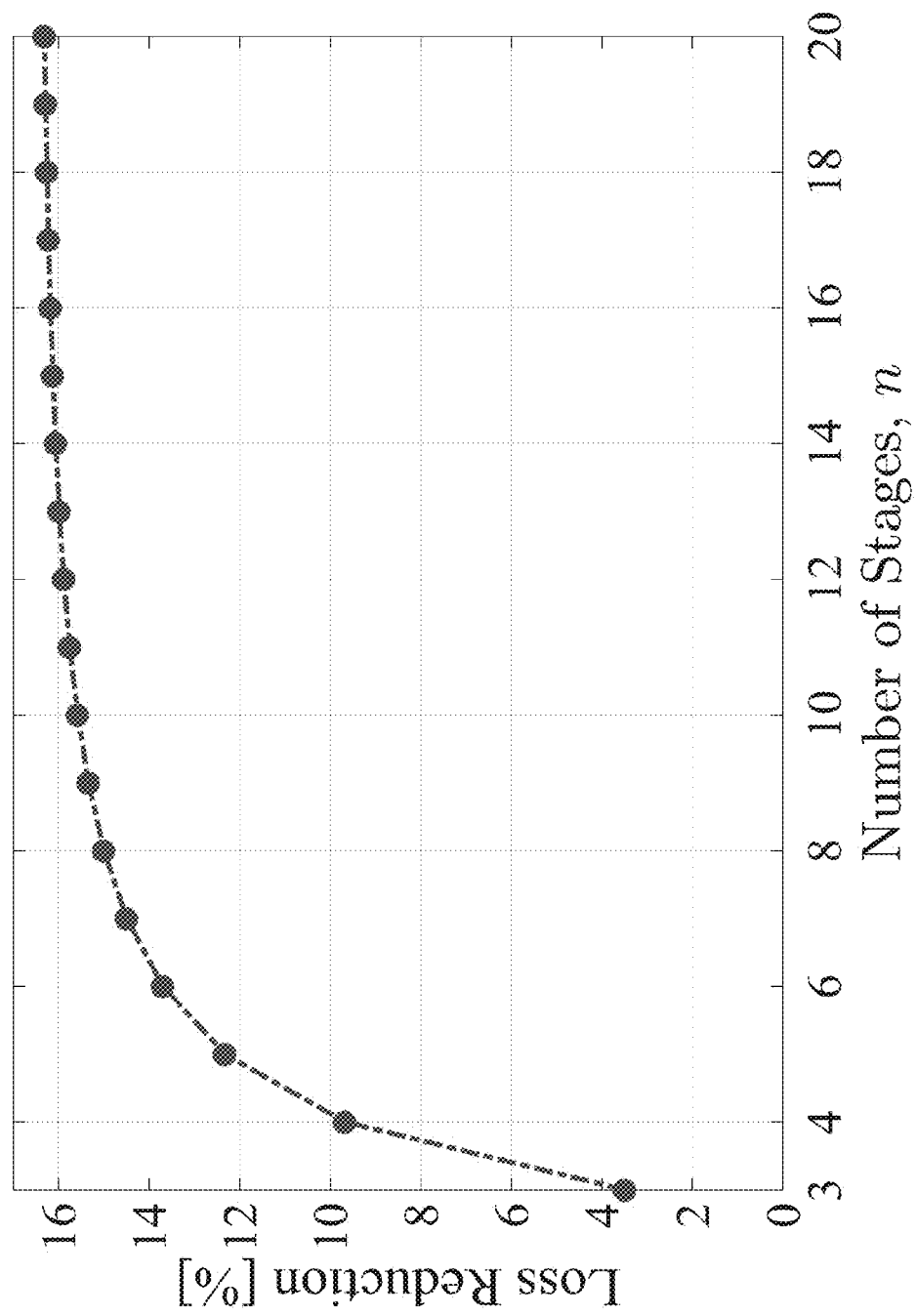

To determine the advantages of the proposed optimization approach, its results are compared with those of the conventional approach. The conventional approach optimally designs multistage matching networks under the constraint that each stage has resistive input and load impedances. The proposed approach relaxes this constraint, resulting in substantially different designs. For instance, under the conventional approach, for any total gain requirement, there is an optimal number of stages for which the multistage network efficiency is maximized. In comparison, as discussed earlier, the proposed design approach predicts that for a broad range of total gain requirement, utilizing a higher number of stages always results in higher efficiencies. For this range of gains, the efficiencies achievable using the proposed approach are consistently higher than those under the conventional approach. This is exemplified for the matching network of FIG. 2(*a*) in FIG. 5(*a*), for a total current gain of 0.05 (equivalently, a voltage step-up ratio of 20) and an inductor quality factor of 100. FIG. 5(*a*) plots the optimal efficiencies predicted by the conventional and the proposed approach as a function of the number of stages. For this total current gain, the conventional approach predicts that using 4 stages is the optimal choice, resulting in an efficiency of 92.5%. In comparison, a 4-stage network designed using the proposed approach is predicted to achieve an efficiency of 93.2%, corresponding to a reduction in losses of nearly 10%. The loss reduction increases if a higher number of stages is used. FIG. 5(*b*) shows the loss reduction achievable using the proposed approach over the optimal 4-stage design of the conventional approach, for the same total current gain of 0.05. As can be seen, losses are reduced by greater than 14% if 6 or more stages are utilized. Also notable in FIG. 5(*b*) is that for this total current gain, a 3-stage network designed using the proposed approach is more efficient than the optimal 4-stage design of the conventional approach. Similar performance enhancements are achievable for all the other multistage network types shown in FIGS. 2(*a*)-2(*d*).

Substantial improvements are also achieved using the proposed approach for other values of total current gain than the one discussed above, including the range of total current gains for which the conventional approach predicts a single-stage design to be the most efficient. For example, for the network of FIG. 2(*a*), the conventional design approach predicts that single-stage networks are optimal for total current gains greater than 0.33, and up to 1. In comparison, under the proposed approach, single-stage designs are optimal for a much narrower range of total current gain: from $$\frac{1}{\sqrt{2}}$$

(=0.707) to 1. Therefore, or r total current gains between 0.33 and $$\frac{1}{\sqrt{2}},$$

while the conventional approach recommends using a single-stage design, the proposed approach suggests that higher efficiencies are achievable if more stages are used. This advantage over the conventional design approach is also maintained for all the other multistage matching networks of FIG. 2.

Figure 6A:
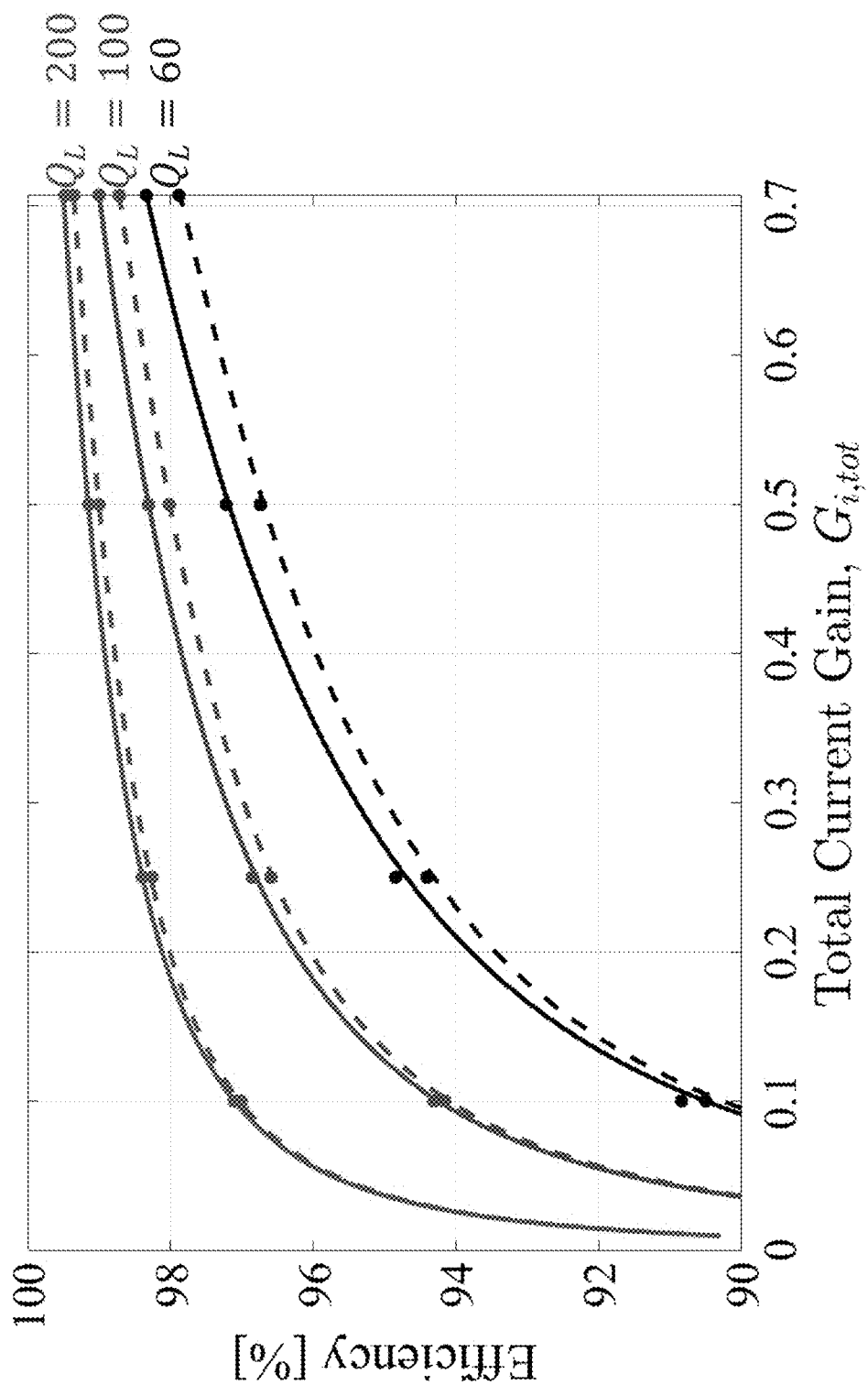
FIG. 6($a$) depicts a graph showing predicted efficiencies for an example two-stage matching network designed using the two approaches are shown as a function of the total current gain, and for three different values of inductor quality factors, according to one or more embodiments described and shown herein.
FIG. 6(b) depicts a graph showing an example percentage loss reduction due to the proposed approach relative to a conventional approach, according to one or more embodiments described and shown herein.
FIGS. 6(c) and 6(d) show graphs showing predicted efficiencies and percentage loss reduction, respectively, for another example three-stage matching network of the type shown in FIG. 2(a), according to one or more embodiments described and shown herein.
Figure 6B:
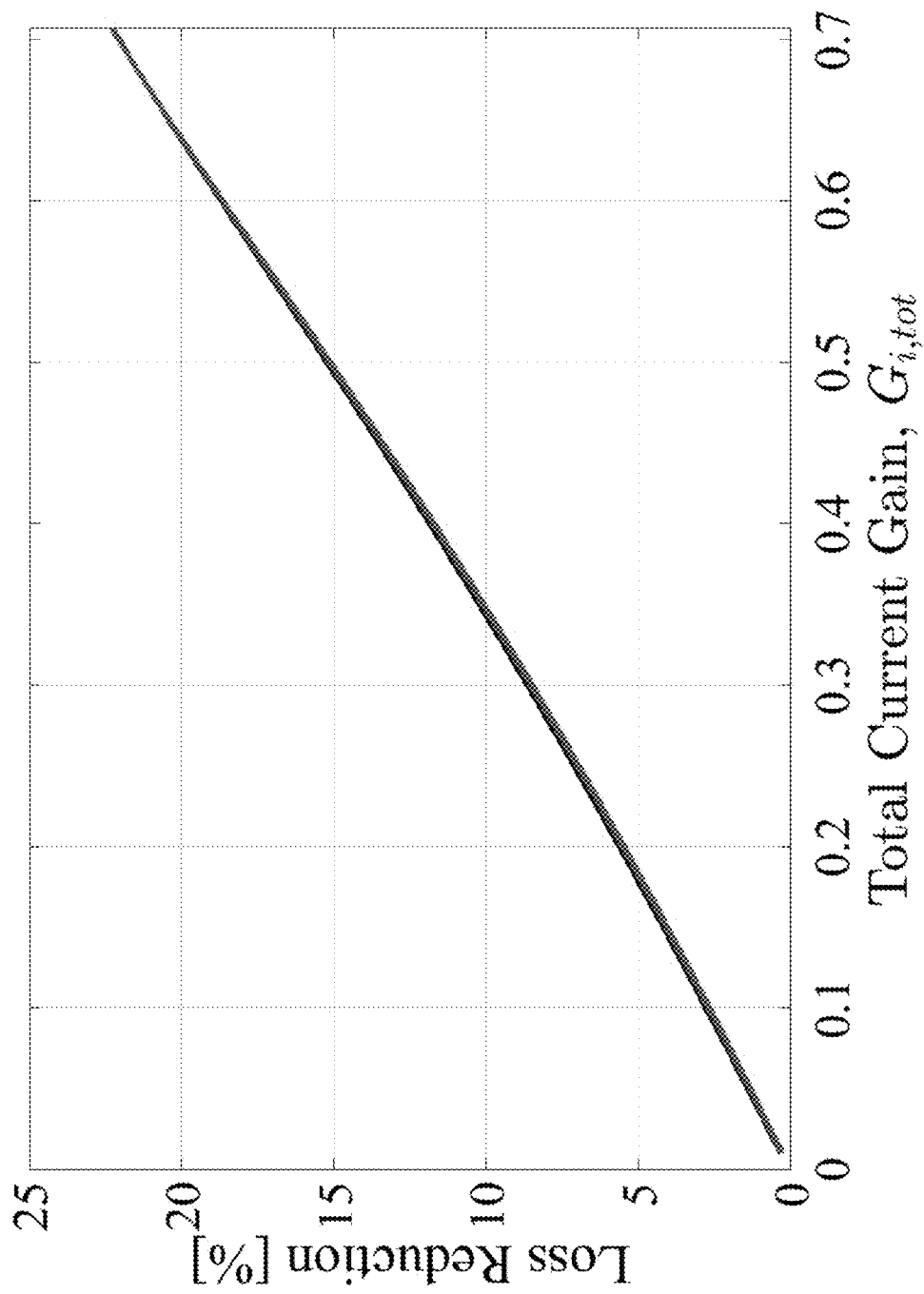
Figure 6C:
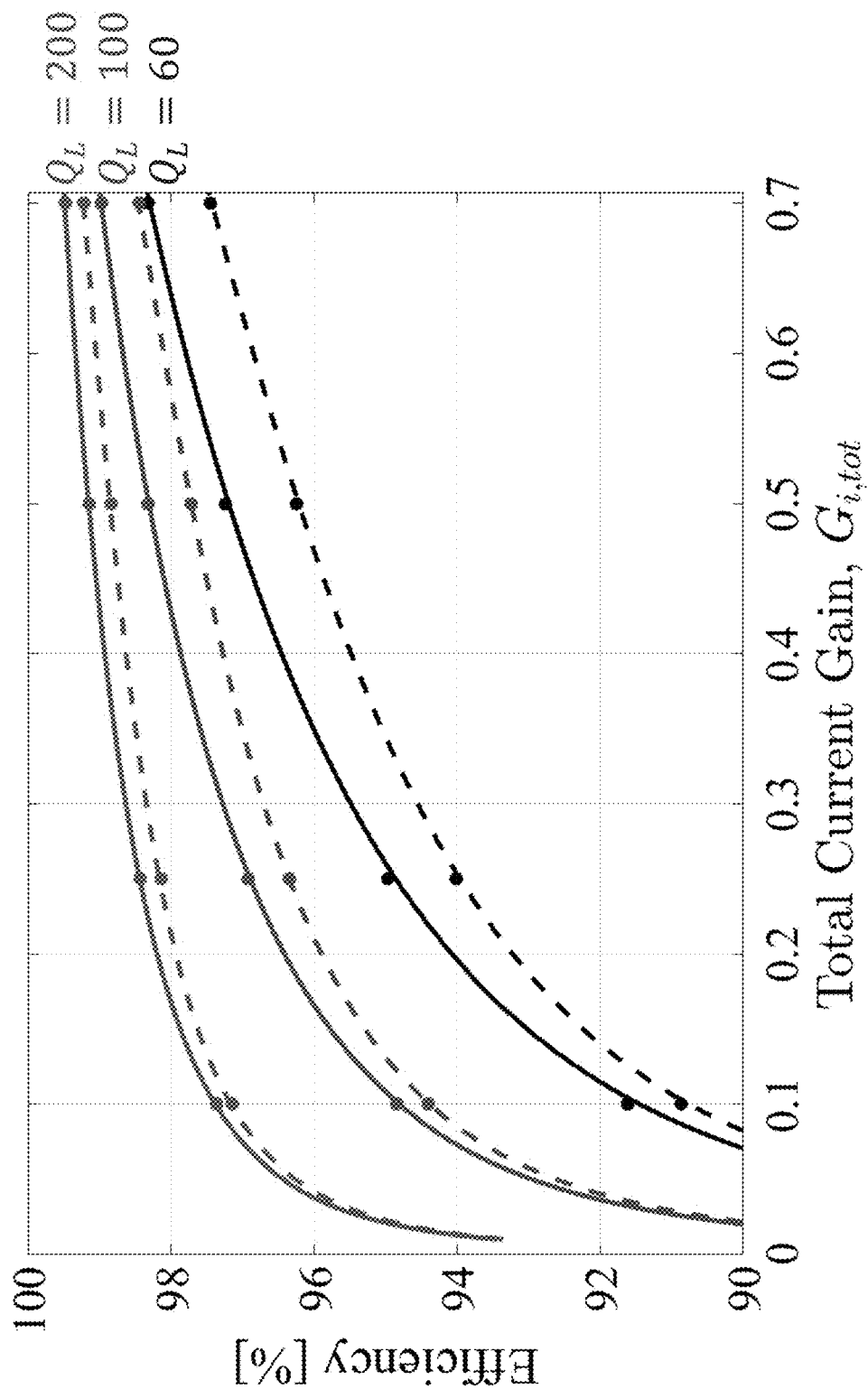
Figure 6D:
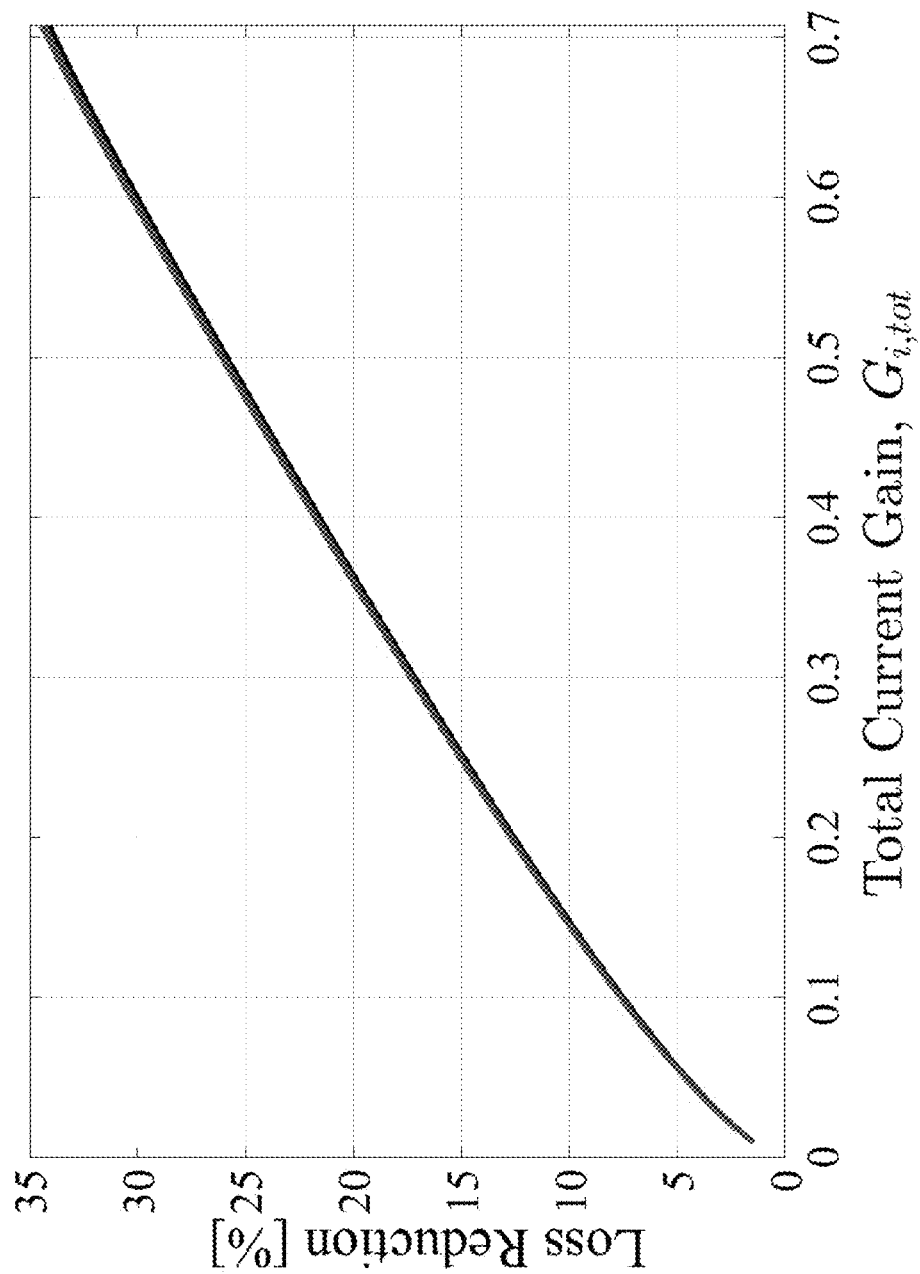

The efficiencies predicted by the conventional and proposed approaches are also compared for a fixed number of stages. A two-stage matching network of the type shown in FIG. 2(a) is designed using both the proposed and the conventional approach. The predicted efficiencies for this two-stage matching network designed using the two approaches are shown as a function of the total current gain, and for three different values of inductor quality factors, in FIG. 6(a). It can be seen that designs resulting from the proposed approach have higher efficiency than the conventional approach. FIG. 6(b) shows the percentage loss reduction due to the proposed approach relative to the conventional approach. The percentage reduction in loss increases with total current gain, but is independent of the inductor quality factor. For a two-stage network, loss reductions in excess of 20% are achievable using the proposed approach. A similar comparison for a three-stage matching network of the type in FIG. 2(a) is shown in FIGS. 6(c) and 6(d). For this network, loss reductions approaching 35% are achievable. The operation and predicted efficiencies of the two-stage and three-stage designs using the proposed and conventional approaches are validated in LTSpice. The LTSpice predicted efficiencies are superimposed as solid circular markers in FIGS. 6(a) and 6(c).

Experimental Results

Figure 7:
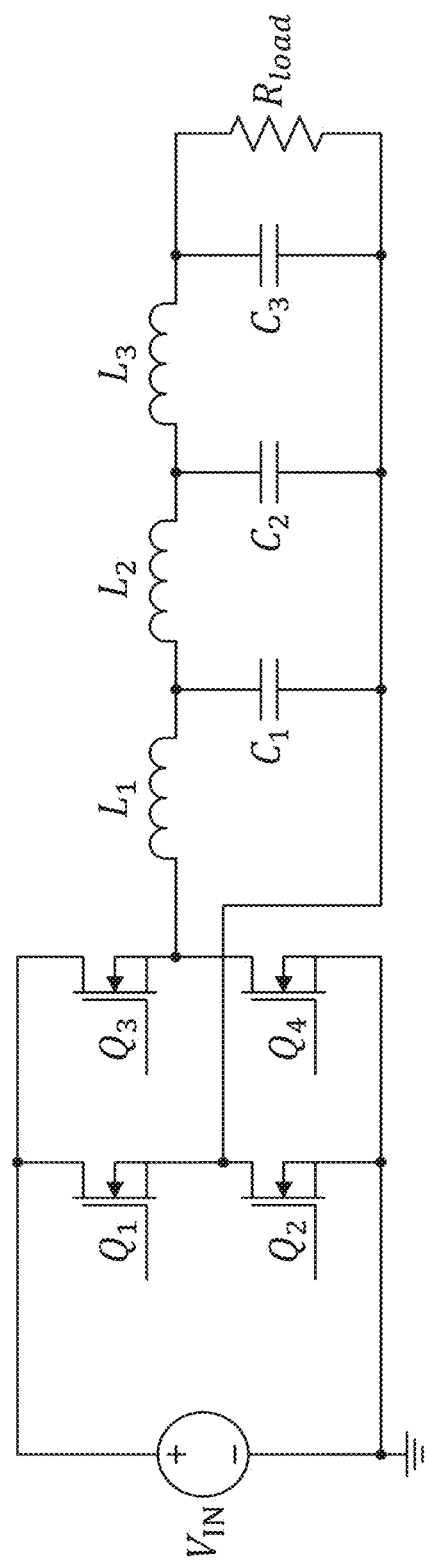
FIG. 7 depicts a schematic diagram of an example multistage matching network, according to one or more embodiments described and shown herein.

To validate the analytical and simulated results, an experimental comparison is performed between the proposed and the conventional design (described above) approaches. Two three-stage matching networks of the type shown in FIG. 2(a) are designed: one based on the conventional approach, and the other using the optimization approach presented herein. Both networks are designed for an operating frequency of 1 MHz, output power of 100 W, and total current gain $G_{i,tot}$ of 0.4. Single-layer solenoidal air-core inductors of quality factor $Q_L \approx 35$ and low-ESR NP0 ceramic capacitors are utilized to realize the matching network inductances and capacitances. The inductance and capacitance values for the two networks are listed in Table V. The matching networks are driven by a full-bridge inverter with a 75 V dc input voltage, as shown in FIG. 7. The inverter is realized using GaN Systems GS66504B 650-V, 15-A enhancement-mode GaN transistors. The matching networks are loaded by a 250Ω RF resistor.

TABLE V

Inductance and Capacitance Values for the Three-Stage Matching Networks Designed using the Proposed and the Conventional Approach

| Design Approach | $L_1$ | $L_2$ | $L_3$ | $C_1$ | $C_2$ | $C_3$ |
|---|---|---|---|---|---|---|
| Proposed | 7.96 μH | 4.49 μH | 6.98 μH | 0.71 nF | 0.45 nF | 0.8 nF |
| Conventional | 5.83 μH | 10.76 μH | 19.82 μH | 2 nF | 1.07 nF | 0.58 nF |

Figure 8:
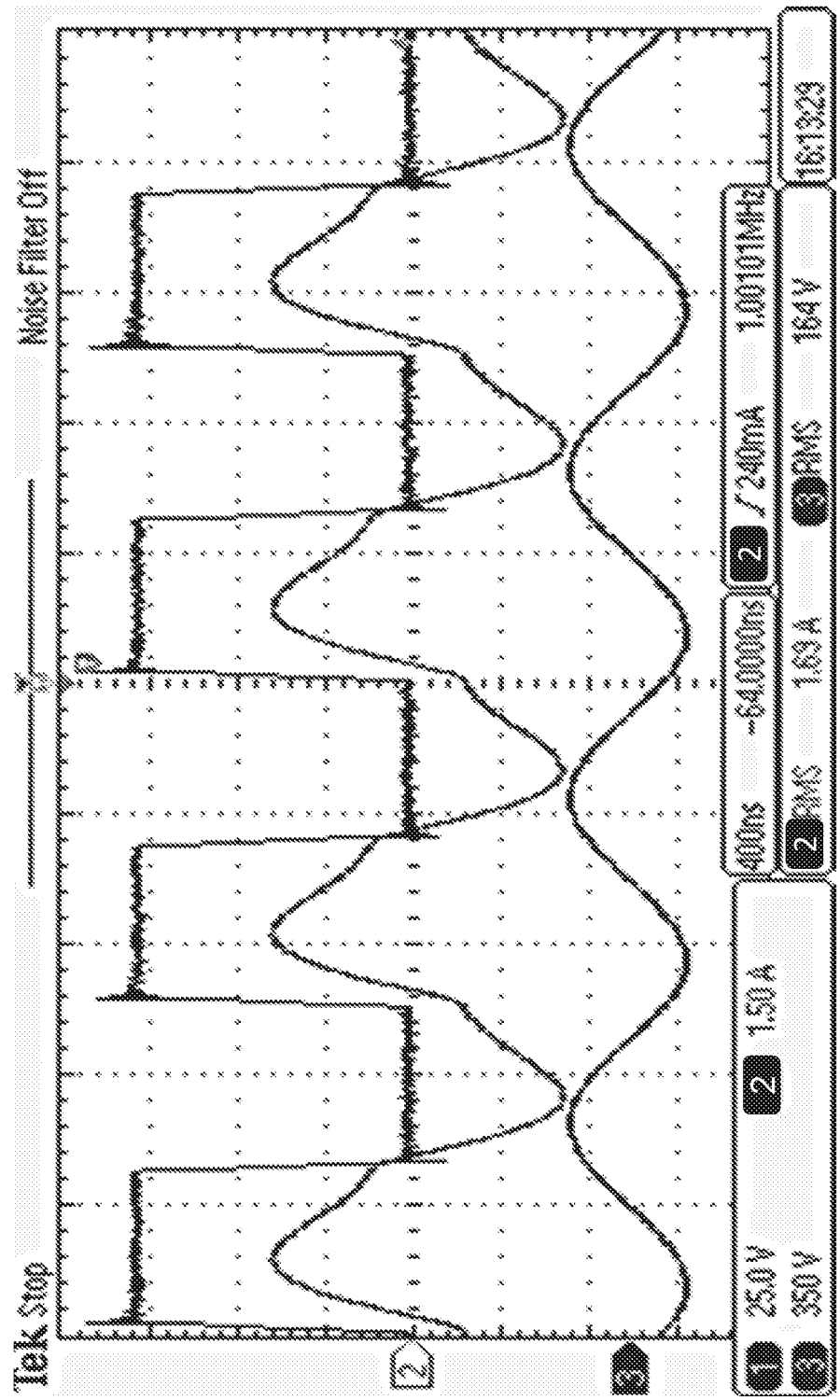
FIGS. 8 and 9 depict graphs showing a measured inverter output voltage, and the matching network input current and output voltage for a conventional and example implementation designs, according to one or more embodiments described and shown herein.
Figure 9:
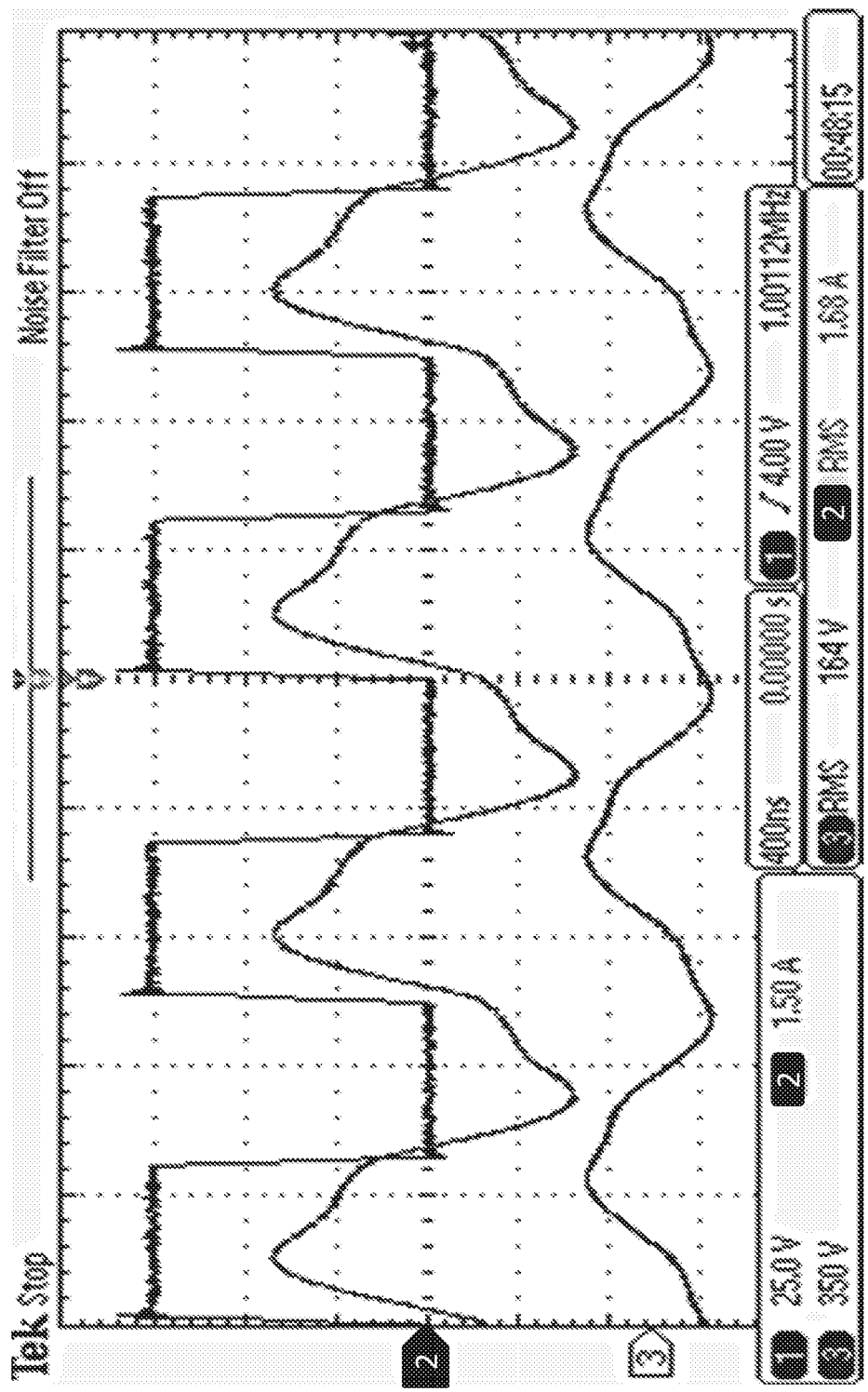
Figure 10A:
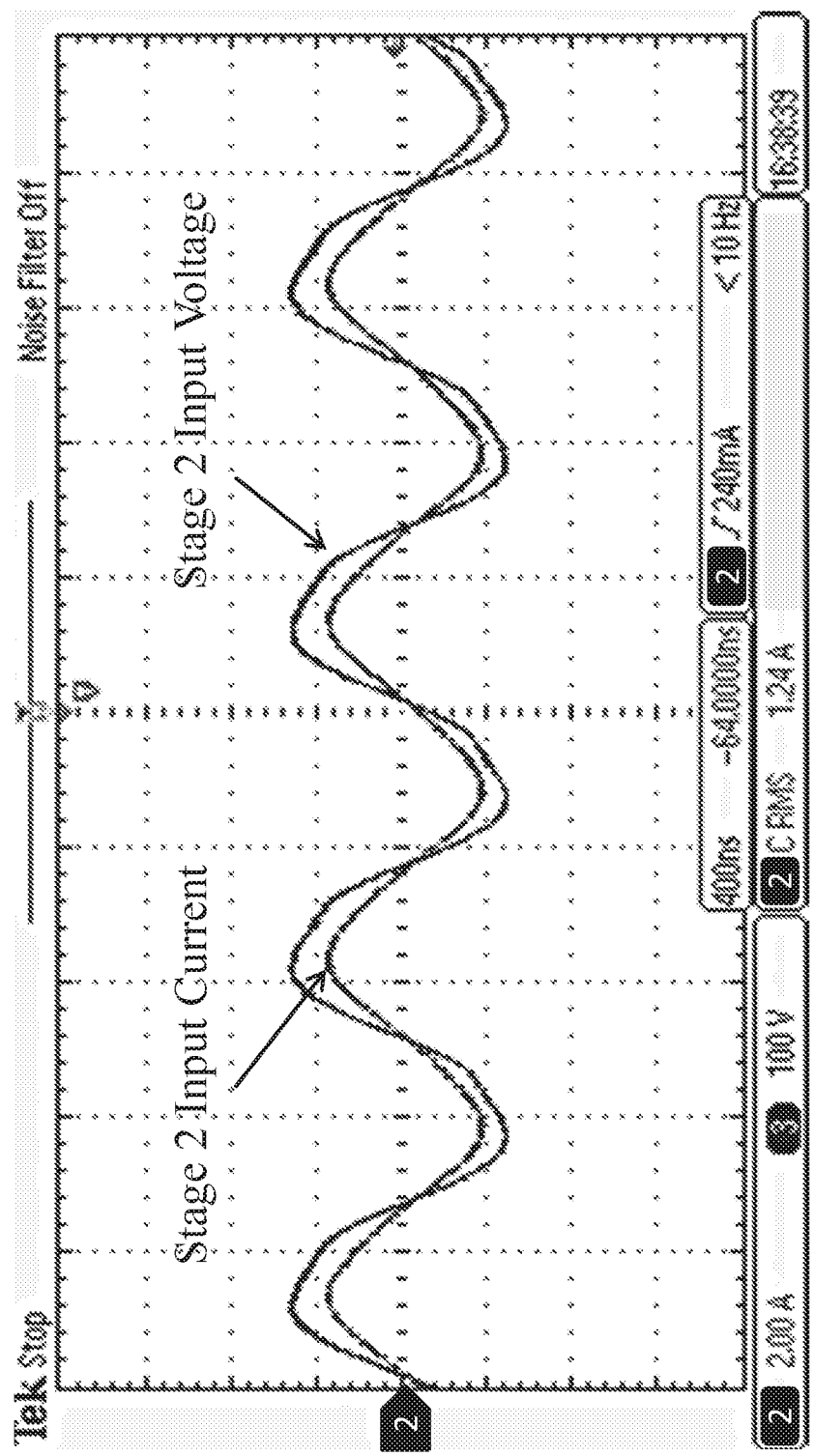
FIGS. 10(a) and 10(b) depict graphs showing voltages and currents at the inputs of the second and third stages of the conventional network described with reference to FIGS. 8 and 9, according to one or more embodiments described and shown herein.
Figure 10B:
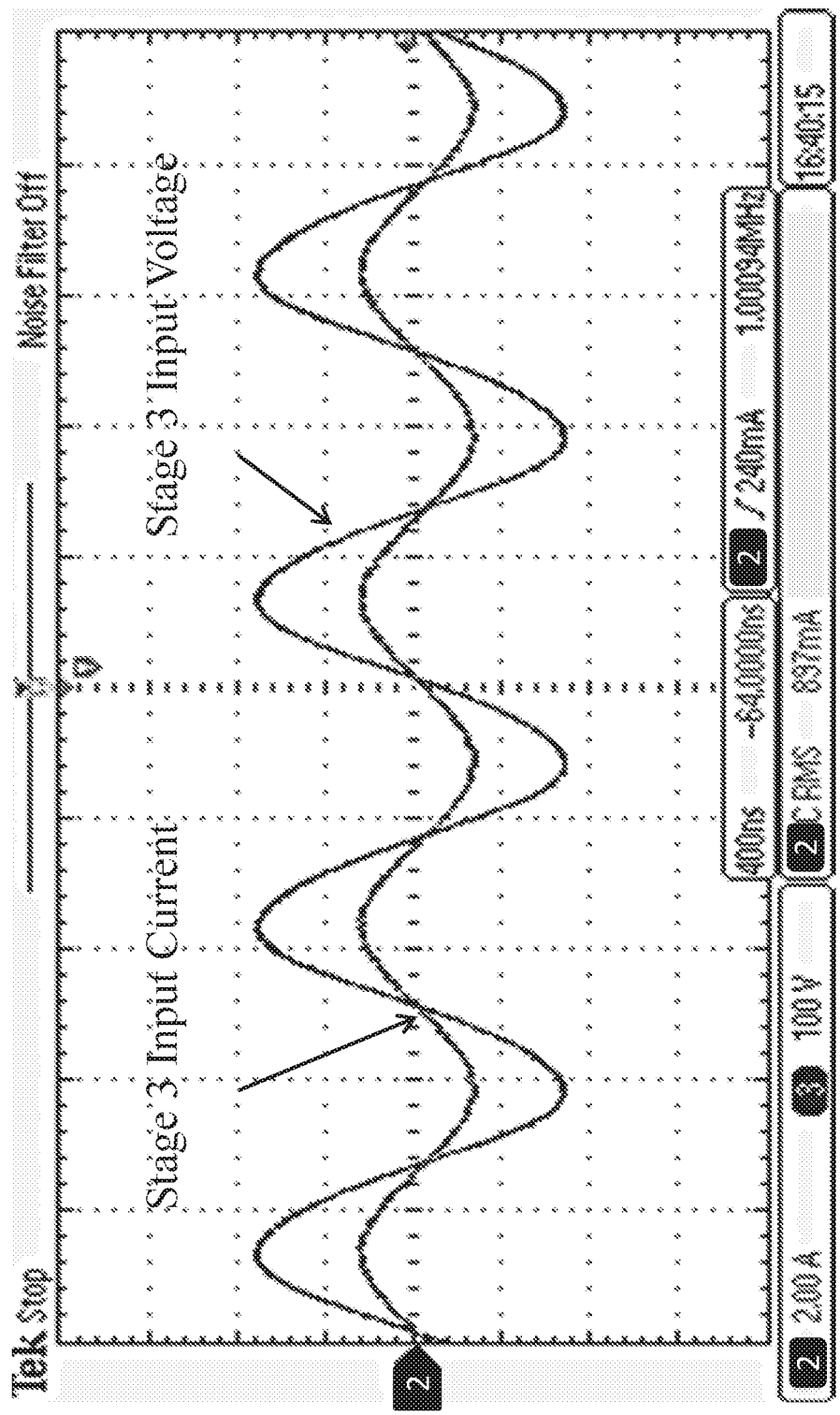
Figure 10C:
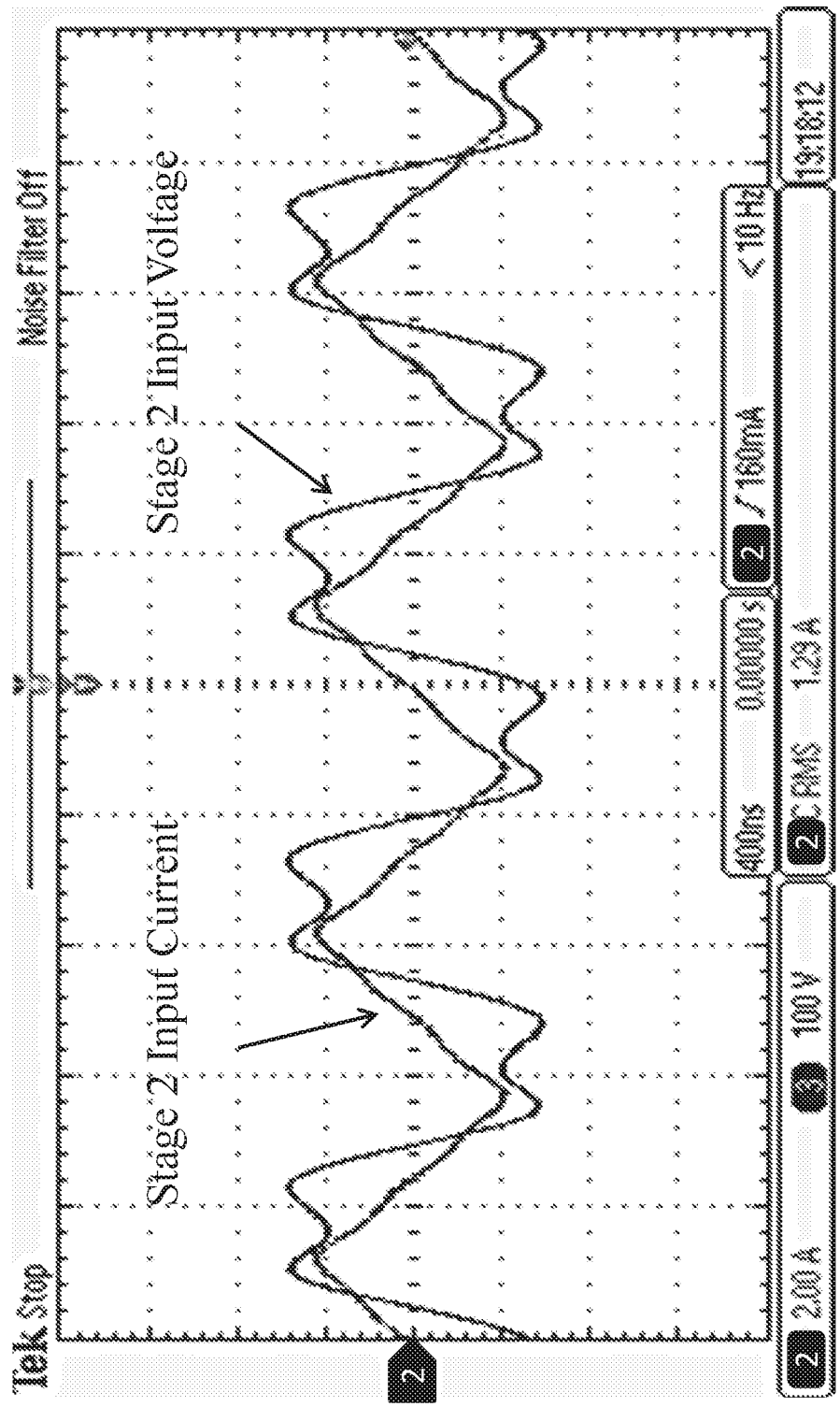
FIGS. 10(c) and 10(d) depict graphs showing voltages and currents at the inputs of the second and third stages of an example implementation of a multistage matching network such as described with reference to FIGS. 8 and 9, according to one or more embodiments described and shown herein.
Figure 10D:
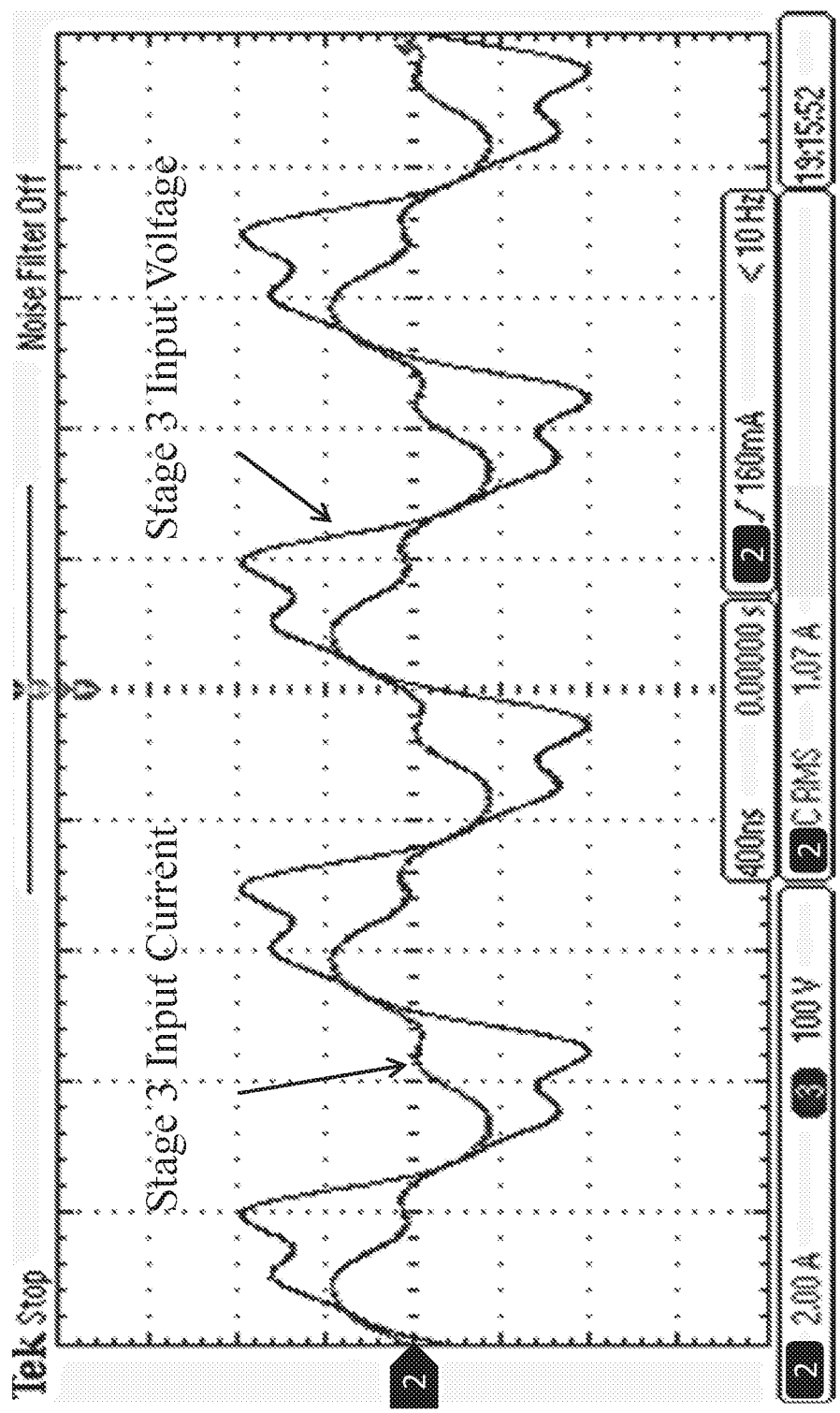
Figure 11A:
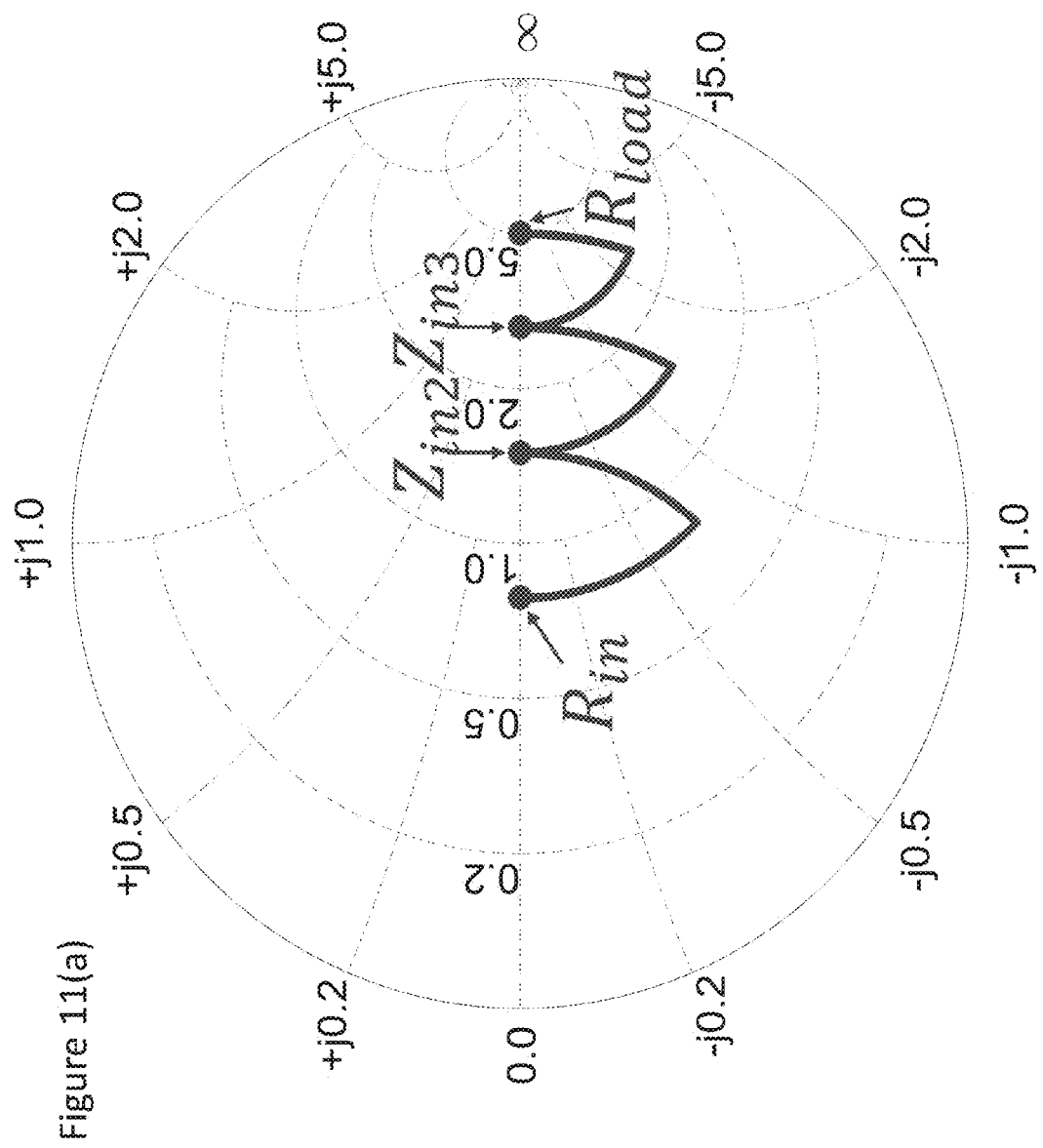
FIG. 11(a) depicts a Smith chart showing input voltages and currents of the second and third stages in a conventional approach, according to one or more embodiments described and shown herein.
Figure 11B:
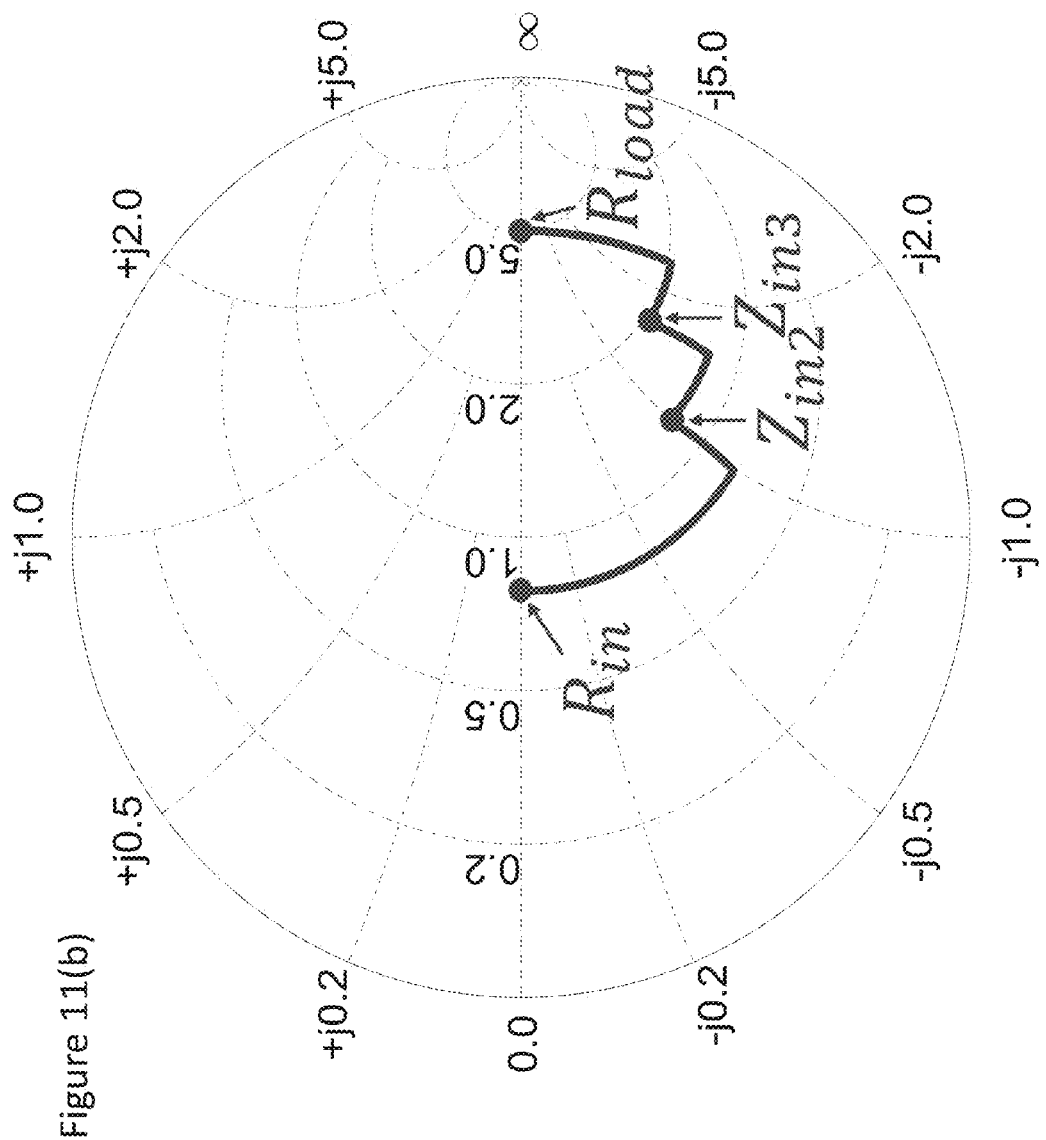
FIG. 11(b) depicts a Smith chart showing the input voltages and currents of second and third stages in an example implementation, according to one or more embodiments described and shown herein.

The measured inverter output voltage, and the matching network input current and output voltage for the conventional and proposed designs, operating at an output power of 100 W, are shown in FIGS. 8 and 9, respectively. As can be seen, both the matching networks appear near-resistive to the inverter. The voltages and currents at the inputs of the second and third stages of the two networks are shown in FIGS. 10(a) and 10(b). It can be seen from FIGS. 10(a) and 10(b) that the input voltages and currents of the second and third stages are in phase, in accordance with the resistive constraint imposed in the conventional approach. This is illustrated graphically using a Smith chart in FIG. 11(a). In comparison, FIGS. 10(c) and 10(d) show that in the network designed using the proposed approach, the second- and third-stage input voltages and currents are not in phase. The currents lead the voltages, indicating that the input impedances of the second and third stages are capacitive, as predicted by the optimization results for the matching network of FIG. 2(a) in Section III, and illustrated in the Smith chart of FIG. 11(b).

The input and output powers of the matching networks are also measured to determine their efficiency and the difference in their losses. The network designed using the proposed approach has an efficiency of 93.9%, which matches well with the analytically predicted efficiency of 94.1% for $G_{i,tot}=0.4$ and $Q_L=35$. The conventionally-designed network has an efficiency of 92.1%, which is also a good match with its analytical prediction of 92.5%. Based on these measurements, the matching network designed using the proposed approach has 24.8% lower losses than the matching network designed using the conventional approach. This correlates well with the 22.5% predicted reduction in losses.

Figure 12A:
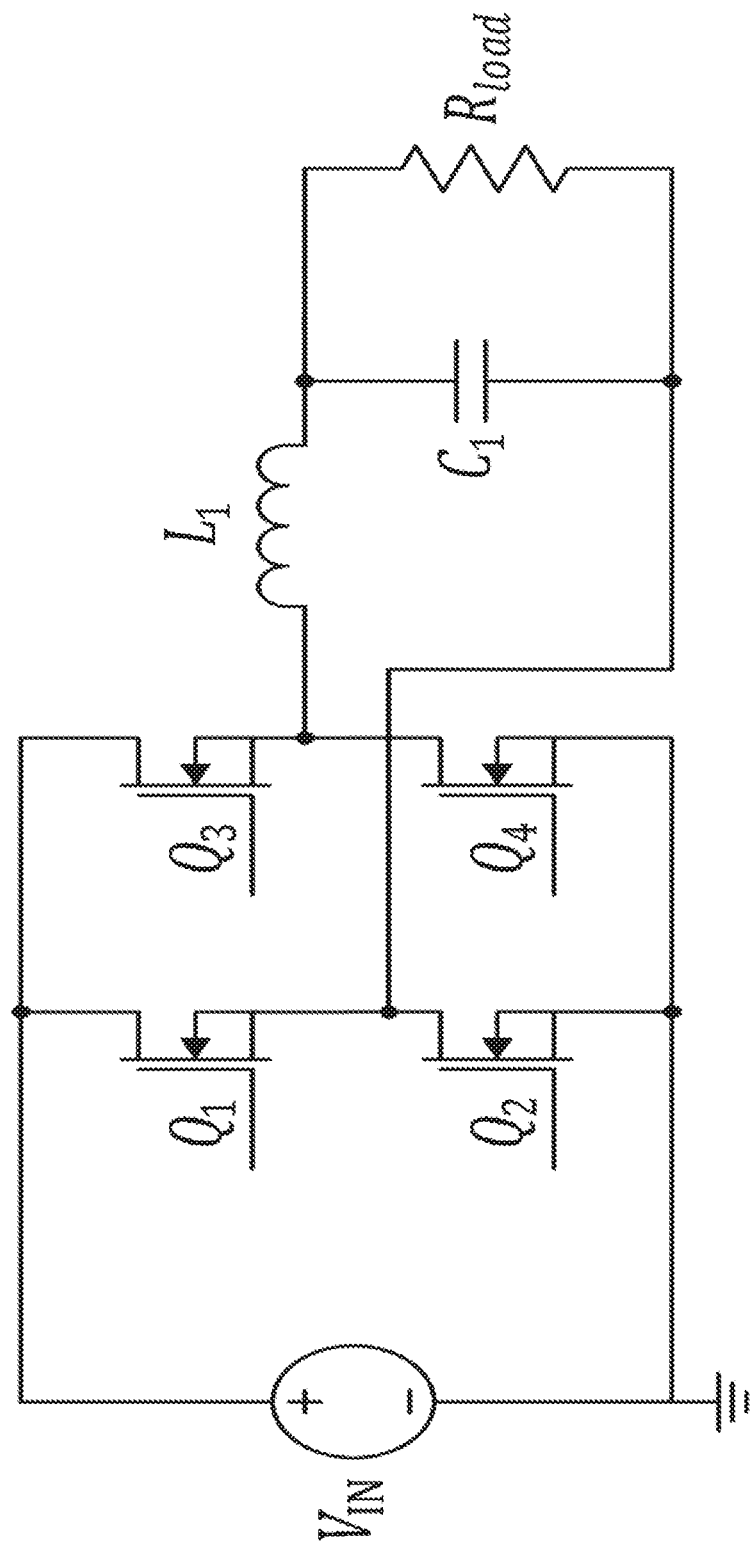
FIG. 12(a) depicts a schematic diagram of an example implementation of a single-stage L-section network, according to one or more embodiments described and shown herein.
Figure 12B:
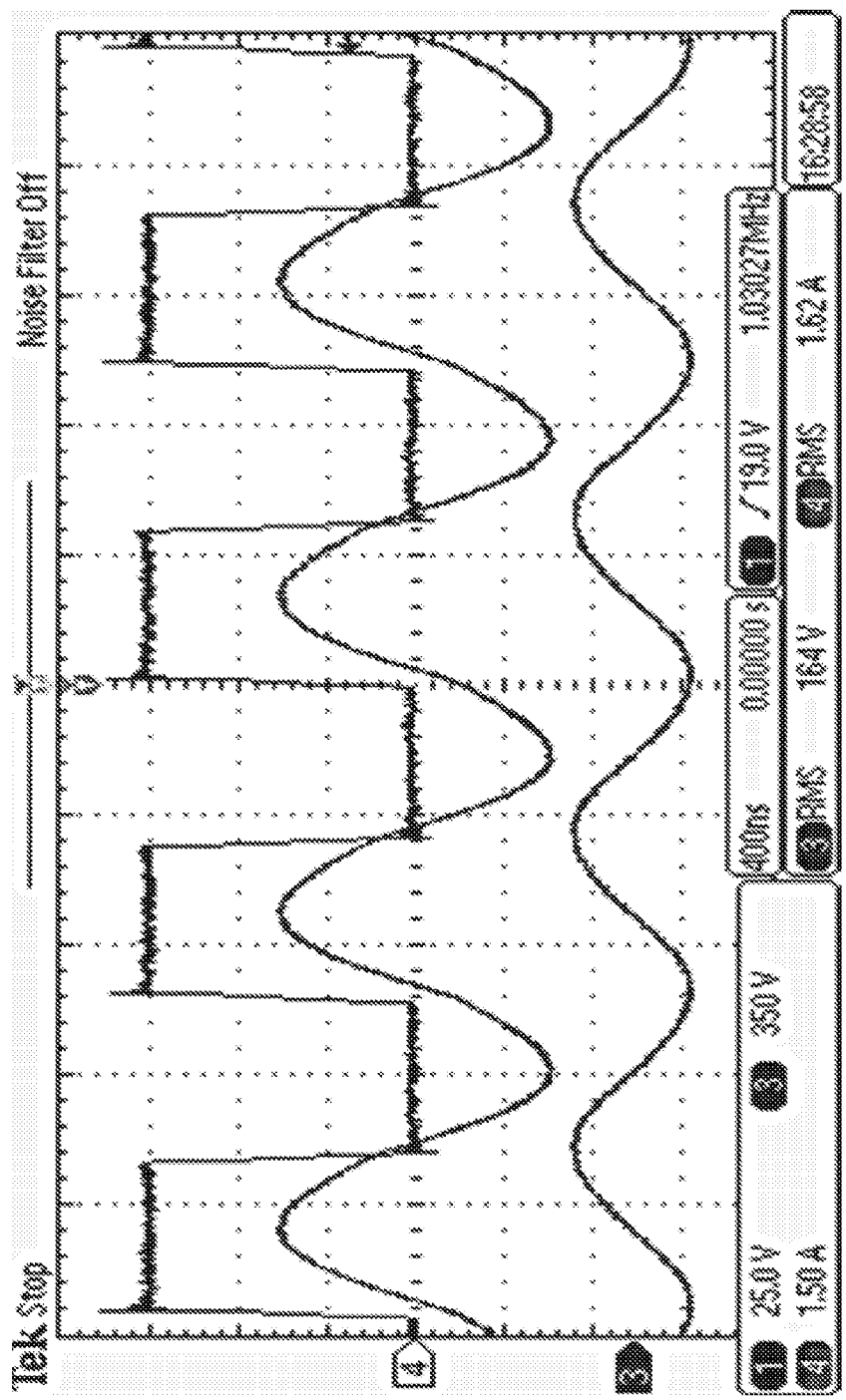
FIG. 12(b) depicts a graph showing example operating waveforms of the example single-stage network shown in FIG. 12(a), according to one or more embodiments described and shown herein.

It may be noted that for a total current gain $G_{i,tot}$ of 0.4, a single-stage network is optimal under the conventional design approach. To further demonstrate the advantages of the proposed design approach, a single-stage L-section network providing a total current gain of 0.4 is built and compared with the three-stage network designed using the proposed approach. This network has an inductance of 14.59 μH, which is realized using a solenoidal air-core inductor with a quality factor $Q_L \approx 35$, and a capacitance of 1.46 nF, which is implemented using an NP0 ceramic capacitor. The network is driven by the same 1-MHz full-bridge inverter and loaded by the same 250Ω RF resistor as the three-stage network. The circuit and operating waveforms of the single-stage system at an output power of 100 W are shown in FIGS. 12(a) and 12(b). The single-stage network has a measured efficiency of 93.1%, which corresponds well with its analytically predicted efficiency of 93.4%. This validates the predictions of both the conventional and proposed design approaches: the single-stage network is more efficient than the conventional three-stage network (92.1%), but less efficient than the proposed three-stage network (93.9%). The proposed three-stage network has 11.6% lower losses than the single-stage network.

Appendix A. Derivation of Efficiency Expressions for the Four L-Section Stages of FIG. 1B This appendix derives the expressions for the efficiency of the four L-section stages shown in FIG. 1, in the form given in (2). The efficiency of an L-section stage can be expressed as:

$$\eta = \frac{P_{out}}{P_{out} + P_{loss,L} + P_{loss,C}}, \quad (16)$$

where $P_{out}$ is the output power of the stage, and $P_{loss,L}$ and $P_{loss,C}$ are the losses in the inductor and the capacitor, respectively. As discussed above, losses in capacitors are typically far smaller than those in inductors, that is, $P_{loss,C} \ll P_{loss,L}$.

Therefore, capacitor losses can be neglected in comparison to inductor losses, and the efficiency of the L-section stage can be approximated as:

$$\eta \approx \frac{P_{out}}{P_{out} + P_{loss,L}} = \frac{1}{1 + \frac{P_{loss,L}}{P_{out}}}. \quad (17)$$

In a high-efficiency L-section stage, the losses are significantly smaller than the output power of the stage, that is, $P_{loss,L} \ll P_{out}$. This enables (17) to be further approximated as:

$$\eta \approx 1 - \frac{P_{loss,L}}{P_{out}}. \quad (18)$$

In the following sub-sections, (18) is used to express the efficiency of the L-section stages of FIG. 1 in terms of their current gain, $G_i$, and impedance characteristics, $Q_{in}$ and $Q_{load}$.

A. L-Section Stage of FIG. 1(a)

The output power of the L-section stage shown in FIG. 1(a) is given by $$\frac{|\hat{I}_{out}|^2}{2} R_{load},$$

and the inductor losses are given by $$\frac{|\hat{I}_{in}|^2}{2} R_L,$$

where $R_L$ is the ac resistance of the inductor, modeling its winding and core losses at the operating frequency. The efficiency of this L-section stage can be expressed as:

$$\eta \approx 1 - \frac{|\hat{I}_{in}|^2 R_L}{|\hat{I}_{out}|^2 R_{load}}. \quad (19)$$

Using the definition of the current gain of the stage, $G_i = |\hat{I}_{out}|/|\hat{I}_{in}|$, and the inductor quality factor, $$Q_L = \frac{2\pi f_s L}{R_L},$$

(19) can be alternatively expressed as:

$$\eta \approx 1 - \frac{2\pi f_s L \left( \frac{1}{G_i^2 R_{load}} \right)}{Q_L}. \quad (20)$$

Finally, using the expression for the inductance L of the L-section stage of FIG. 1(a) given in Table I, the efficiency of this L-section stage can be expressed in the following form:

$$\eta \approx 1 - \frac{\left( \frac{1}{G_i} \sqrt{(1 - G_i^2) + Q_{load}^2} + Q_{in} \right)}{Q_L}. \quad (21)$$

The expression inside the parenthesis in (21) is defined as the effective transformation factor $Q_{eff}$ of the L-section stage of FIG. 1(a).

B. L-Section Stage of FIG. 1(b)

The output power of the L-section stage of FIG. 1(b) is given by $$\frac{|\hat{I}_{out}|^2}{2} R_{load},$$

and the inductor losses can be expressed as $$\frac{|\hat{I}_{in} - \hat{I}_{out}|^2}{2} R_L.$$

The efficiency of the L-section stage of FIG. 1(b) is then given by:

$$\eta \approx 1 - \frac{|\hat{I}_{in} - \hat{I}_{out}|^2 R_L}{|\hat{I}_{out}|^2 R_{load}}. \quad (22)$$

The input current of the stage $\hat{I}_{in}$ can be expressed in terms of the output current $\hat{I}_{out}$ as:

$$\hat{I}_{in} = \frac{R_{load} + j(X_L + X_{load})}{jX_L} \hat{I}_{out}. \quad (23)$$

Using (23) and replacing the inductor reactance $X_L$ with $2\pi f_s L$, the efficiency expression in (22) can be simplified to:

$$\eta \approx 1 - \frac{\frac{1}{2\pi f_s L} \left( \frac{R_{load}^2 + X_{load}^2}{R_{load}} \right)}{Q_L}. \quad (24)$$

The inductance L in (24) can now be replaced with the inductance expression for the L-section stage of FIG. 1(b) given in Table I, and the resultant efficiency expression is given by:

$$\eta \approx 1 - \frac{\left( \frac{1}{G_i} \sqrt{(1 - G_i^2) + Q_{load}^2} - Q_{load} \right)}{Q_L}. \quad (25)$$

The parenthesized expression in (25) represents the effective transformation factor $Q_{eff}$ of the L-section stage of FIG. 1($b$).

C. L-Section Stage of FIG. 1($c$)

The output power of the L-section stage of FIG. 1($c$) is given by $$\frac{|\hat{I}_{out}|^2}{2} R_{load},$$

and the inductor losses can be expressed as $$\frac{|\hat{I}_{out}|^2}{2} R_L.$$

Using (18), the efficiency of the L-section stage of FIG. 1($c$) is then given by:

$$\eta \approx 1 - \frac{R_L}{R_{load}}. \tag{26}$$

Expressing the inductor ac resistance $R_L$ as $$\frac{2\pi f_s L}{Q_L},$$

the efficiency expression in (26) can be rewritten as:

$$\eta \approx 1 - \frac{2\pi f_s L \left(\frac{1}{R_{load}}\right)}{Q_L}. \tag{27}$$

The expression for the inductance L of the L-section of FIG. 1($c$) given in Table I can now to be utilized to convert (27) to the following form:

$$\eta \approx 1 - \frac{\left(G_i \sqrt{\left(1 - \frac{1}{G_i^2}\right) + Q_{in}^2} - Q_{load}\right)}{Q_L}. \tag{28}$$

The expression under the parenthesis in (28) is defined as the effective transformation factor $Q_{eff}$ of the L-section stage of FIG. 1($c$).

D. L-Section Stage of FIG. 1($d$)

The derivation of the efficiency expression for the L-section stage of FIG. 1($d$) proceeds identically as sub-sections A, B and C above. First, the output power of the L-section stage is expressed as $$\frac{|\hat{I}_{out}|^2}{2} R_{load},$$

and the inductor losses as $$\frac{|\hat{I}_{in} - \hat{I}_{out}|^2}{2} R_L$$

This results in the following expression for the efficiency of this L-section stage:

$$\eta \approx 1 - \frac{|\hat{I}_{in} - \hat{I}_{out}|^2 R_L}{|\hat{I}_{out}|^2 R_{load}}. \tag{29}$$

The input current of the L-section stage, $\hat{I}_{in}$, can be expressed in terms of its output current $\hat{I}_{out}$ as:

$$\hat{I}_{in} = \frac{R_{load} + j(X_L + X_C + X_{load})}{jX_L} \hat{I}_{out}. \tag{30}$$

Expressing the inductor and capacitor reactances as $2\pi f_s L$ and $$-\frac{1}{2\pi f_s C},$$

respectively, and utilizing the relationship given in (30), the efficiency expression in (29) can be alternatively written as:

$$\eta \approx 1 - \frac{\frac{1}{2\pi f_s L}\left(\frac{R_{load}^2 + \left(X_{load} \frac{1}{2\pi f_s C}\right)^2}{R_{load}}\right)}{Q_L}. \tag{31}$$

The inductance L and capacitance C in (31) can be replaced with the corresponding expressions for the L-section stage of FIG. 1($d$) given in Table I, leading to the efficiency of this L-section stage being expressible as:

$$\eta \approx 1 - \frac{\left(G_i \sqrt{\left(1 - \frac{1}{G_i^2}\right) + Q_{in}^2} + Q_{in}\right)}{Q_L}. \tag{32}$$

The effective transformation factor $Q_{eff}$ for the L-section stage of FIG. 1($d$) is given by the parenthesized expression in (32).

Appendix B. Derivation of Asymptotic Maximum Efficiency Expressions for the Multistage Matching Networks of FIG. 2

This appendix derives the expression for the asymptotic maximum efficiency of the multistage matching networks of FIG. 2 as given in Table IV. For the network of FIG. 2($a$), using the optimal design relationships of (8)-(10), the sum of the effective transformation factors of the n stages, $\Sigma_{k=1}^{n} Q_{eff,k}$, can be expressed as:

$$\sum_{k=1}^{n} Q_{eff,k} = (n-1)\left(\frac{1}{G_{i,eq}} - G_{i,eq}\right) + \frac{1}{G_{i,tot}^2}\left(\frac{G_{i,eq}^{2n-1}}{1 + G_{i,eq}^2}\right). \tag{33}$$

As the number of stages n increases, the sum of the effective transformation factors approaches an asymptotic minimum value that can be evaluated using:

where $$\lim_{n\to\infty} \sum_{k=1}^{n} Q_{eff,k} = l_1 + l_2. \qquad (34)$$

$$l_1 = \lim_{n\to\infty} (n-1)\left(\frac{1}{G_{i,eq}} - G_{i,eq}\right)$$

and $$l_2 = \lim_{n\to\infty} \frac{1}{G_{i,tot}^2}\left(\frac{G_{i,eq}^{2n-1}}{1+G_{i,eq}^2}\right).$$

Taking the natural logarithm of both sides of (9) and using the resulting expression for n−1, the limit $l_1$ can be expressed as:

$$l_1 = \lim_{n\to\infty} \frac{1-G_{i,eq}^2}{2G_{i,eq}\ln(G_{i,eq})}\left(\ln\left(G_{i,tot}\left(\frac{1+G_{i,eq}^2}{G_{i,eq}}\right)\right) + \frac{\ln(G_{i,eq}^{2(n-1)} - G_{i,tot}^2)}{2}\right). \qquad (35)$$

As the number of stages n increases, the optimal equal current gain $G_{i,eq}$ approaches 1. Using this property, $l_1$ is further simplified to:

$$l_1 = \lim_{n\to\infty}\left(-\ln(2G_{i,tot}) - \frac{\ln(G_{i,eq}^{2n-1} - G_{i,tot}^2)}{2}\right). \qquad (36)$$

Solving (9) as a quadratic equation in $G_{i,eq}$ it can be shown that:

$$\lim_{n\to\infty} G_{i,eq}^{n-1} = \sqrt{2}\, G_{i,tot}. \qquad (37)$$

The limit in (36) can now be evaluated using (37), reducing $l_1$ to the following expression:

$$l_1 = -\ln(2G_{i,tot}^2). \qquad (38)$$

The limit $l_2$ in (34) can be evaluated by solving (9) for $G_{i,tot}$, which results in the following relationship:

$$G_{i,tot} = G_{i,eq}^{n-1}\sqrt{\frac{1+\sqrt{1-\left(\frac{2G_{i,eq}}{1+G_{i,eq}^2}\right)^2}}{2}}. \qquad (39)$$

Substituting the right-hand side of (39) in the expression for $l_2$, and applying the property that $G_{i,eq} \to 1$ as $n\to\infty$, it can be shown that:

$$l_2 = 1. \qquad (40)$$

Using the evaluated limits given in (38) and (40), the asymptotic minimum limit of the sum of the effective transformation factors of the n stages of the multistage matching network is given by:

$$\lim_{n\to\infty} \sum_{k=1}^{n} Q_{eff,k} = 1 - \ln(2G_{i,tot}^2) \qquad (41)$$

This expression can be used to determine the asymptotic maximum efficiency of the multistage network of FIG. 2(a), which is then given by:

$$\eta_{max} = \lim_{n\to\infty} \eta_{multistage,opt} = 1 - \frac{1-\ln(2G_{i,tot}^2)}{Q_L}. \qquad (42)$$

The procedure outlined above is applicable to the other multistage networks of FIG. 2 as well. For the network of FIG. 2(b), the asymptotic maximum efficiency has the same expression as that given by (42). Finally, for the networks of FIGS. 2(c) and 2(d), the asymptotic maximum efficiency comes out to be:

$$\eta_{max} = \lim_{n\to\infty} \eta_{multistage,opt} = 1 - \frac{1-\ln(2G_{i,tot}^2)}{Q_L}. \qquad (43)$$

Appendix C. Reasoning Behind Single-Stage Designs being Optimal for Certain Ranges of Total Current Gain This appendix provides the reasoning behind the conclusion presented in Section III that for a range of total current gains $G_{i,tot}$, a single-stage network is the optimal choice under the proposed design approach. Consider the multistage network of FIG. 2(a), in which for total current gains greater than $$\frac{1}{\sqrt{2}},$$

the optimal current gains of the first n−1 stages are equal to 1 (as shown in (15)). Hence, utilizing (1a) and (1b), the inductance and capacitance values of these stages simplify to:

$$L_k\,|_{G_i=1} = \frac{1}{2\pi f_s}(Q_{in,k} + Q_{load,k})R_{load,k}, \qquad (44)$$

$$C_k\,|_{G_i=1} = \frac{1}{2\pi f_s}\frac{2Q_{load,k}}{(1+Q_{load,k}^2)R_{load,k}}. \qquad (45)$$

It is evident from (45) that for the first n−1 stages to have non-negative capacitance, their load impedance characteristics must also be non-negative, that is:

$$Q_{load,k} \geq 0 \;\; \forall k \in \{1,2,\ldots,n-1\}. \qquad (46)$$

This property can now be utilized to demonstrate the optimal design for the first n−1 stages. Under the condition that the first n−1 stages provide current gains of 1, the sum of the effective transformation factors of the multistage network of FIG. 2(a) can be expressed as (see Table II):

$$\sum_{k=1}^{n} Q_{eff,k} = 2(Q_{load,1} + Q_{load,2} + \ldots + Q_{load,n-1}) + \frac{1}{G_{i,tot}}\sqrt{1-G_{i,tot}^2}. \qquad (47)$$

Since the last term on the right-hand side of (47) is a fixed positive quantity, the sum of the effective transformation factors will be minimized, and efficiency maximized, when the sum of the load impedance characteristics of the first n−1 stages, $(Q_{load,1}+Q_{load,2}+\ldots+Q_{load,n-1})$, is minimized. Since the load impedance characteristic of each of the first n−1 stages is non-negative (see (46)), this sum is minimized when each load impedance characteristic is zero. Given that the load impedance characteristic of each stage equals the input impedance characteristic of the following stage (that is, $Q_{load,k}=Q_{in,k+1}$), it can be concluded using (44) and (45) that the first n−1 stages of this multistage network have inductance and capacitance values of zero. This eliminates the first n−1 stages, and the remaining single-stage network is the optimal design. A similar approach can be used to show that for an optimal design, the other multistage networks of FIG. 2 also collapse to single-stage networks for certain ranges of total current gain.

Although implementations have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A multistage matching network comprising:
   a first stage providing an input stage of the matching network, the first stage comprising a pair of matching network input terminals, a pair of first stage output terminals, and at least two first stage reactive components disposed between the pair of matching network input terminals and the pair of first stage output terminals, the first stage comprising a near-resistive input impedance; and
   a second stage providing an output stage of the matching network, the second stage comprising a pair of second stage input terminals coupled to the pair of first stage output terminals, a pair of matching network output terminals, and at least two second stage reactive components disposed between the pair of second stage input terminals and the pair of matching network output terminals, the second stage comprising a complex input impedance and a near-resistive load impedance.

2. The multistage matching network of claim 1 wherein the pair of second stage input terminals is coupled to the pair of first stage output terminals via at least one series connected intermediate stages.

3. The multistage matching network of claim 1 wherein a third stage providing an intermediate stage of the matching network comprises a pair of third stage input terminals coupled to the first stage output terminals, a pair of third stage output terminals coupled to the pair of second stage input terminals, and at least two third stage reactive components disposed between the pair of third stage input terminals and the pair of third stage output terminals, the third stage comprising a complex input impedance, wherein the first stage, second stage, and third stage are coupled in series.

4. The multistage matching network of claim 1 wherein the at least two reactive components of the first stage comprise a first reactive component disposed in series between a first terminal of the pair of matching network input terminals and a first terminal of the pair of first stage output terminals and a second reactive component disposed between the first terminal of the pair of matching network input terminals and a second terminal of the pair of matching network input terminals.

5. The multistage matching network of claim 1 wherein the at least two reactive components of the first stage comprise a first reactive component disposed in series between a first terminal of the pair of matching network input terminals and a first terminal of the pair of first stage output terminals and a second reactive component disposed between the first terminal of the pair of first stage output terminals and a second terminal of the pair of first stage output terminals.

6. The multistage matching network of claim 1 wherein the at least two reactive components of the second stage comprise a first reactive component disposed in series between a first terminal of the pair of second stage input terminals and a first terminal of the pair of matching network output terminals and a second reactive component disposed between the first terminal of the pair of second stage input terminals and a second terminal of the pair of second stage input terminals.

7. The multistage matching network of claim 1 wherein the at least two reactive components of the second stage comprise a first reactive component disposed in series between a first terminal of the pair of second stage input terminals and a first terminal of the pair of matching network output terminals and a second reactive component disposed between the first terminal of the pair of matching network output terminals and a second terminal of the pair of matching network output terminals.

8. The multistage matching network of claim 1 wherein at least three reactive components comprise a π reactive network.

9. The multistage matching network of claim 1 wherein at least three reactive components comprise a T reactive network.

10. The multistage matching network of claim 1 wherein the at least two reactive components of the second stage comprises at least one capacitor and at least one inductor.

11. The multistage matching network of claim 1 wherein the at least two reactive components of the first stage comprise at least one capacitor and at least one inductor.

12. The multistage matching network of claim 11 wherein the at least one capacitor and the at least one inductor have capacitance or inductance values determined by the following:

$$C = \frac{1-G_i^2}{2\pi f_s \left(G_i\sqrt{(1-G_i^2)+Q_{load}^2} - G_i^2 Q_{load}\right) R_{load}},$$

and $$L = \frac{\left(G_i\sqrt{(1-G_i^2)+Q_{load}^2} + G_i^2 Q_{in}\right)R_{load}}{2\pi f_s}.$$

13. The multistage matching network of claim 11 wherein the at least one capacitor and the at least one inductor have capacitance or inductance values determined by the following:

$$C = \frac{1}{2\pi f_s\left(G_i\sqrt{(1-G_i^2)+Q_{load}^2} - G_i^2 Q_{in}\right)R_{load}},$$

and $$L = \frac{\left(G_i\sqrt{(1-G_i^2)+Q_{load}^2} + G_i^2 Q_{load}\right)R_{load}}{2\pi f_s(1-G_i^2)}.$$

14. The multistage matching network of claim 11 wherein the at least one capacitor and the at least one inductor have capacitance or inductance values determined by the following:

$$C = \frac{1-\frac{1}{G_i^2}}{2\pi f_s\left(\sqrt{(G_i^2-1)+G_i^2 Q_{in}^2} + Q_{in}\right)R_{load}},$$

and $$L = \frac{\left(\sqrt{(G_i^2-1)+G_i^2 Q_{in}^2} - Q_{load}\right)R_{load}}{2\pi f_s}.$$

15. The multistage matching network of claim 11 wherein the at least one capacitor and the at least one inductor have capacitance or inductance values determined by the following:

$$C = \frac{1}{2\pi f_s\left(\sqrt{(G_i^2-1)+G_i^2 Q_{in}^2} + Q_{load}\right)R_{load}},$$

and $$L = \frac{\left(\sqrt{(G_i^2-1)+G_i^2 Q_{in}^2} - Q_{in}\right)R_{load}}{2\pi f_s\left(1-\frac{1}{G_i^2}\right)}.$$

16. The multistage matching network of claim 11 wherein the at least two reactive components of the second stage comprises at least one capacitor and at least one inductor.

17. The multistage matching network of claim 16 wherein the at least one capacitor and at least one inductor have capacitance or inductance values determined by the following:

$$C = \frac{1-G_i^2}{2\pi f_s\left(G_i\sqrt{(1-G_i^2)+Q_{load}^2} - G_i^2 Q_{load}\right)R_{load}}$$

and $$L = \frac{\left(G_i\sqrt{(1-G_i^2)+Q_{load}^2} + G_i^2 Q_{in}\right)R_{load}}{2\pi f_s}.$$

18. The multistage matching network of claim 16 wherein the at least one capacitor and the at least one inductor have capacitance or inductance values determined by the following:

$$C = \frac{1}{2\pi f_s\left(G_i\sqrt{(1-G_i^2)+Q_{load}^2} - G_i^2 Q_{in}\right)R_{load}},$$

and $$L = \frac{\left(G_i\sqrt{(1-G_i^2)+Q_{load}^2} + G_i^2 Q_{load}\right)R_{load}}{2\pi f_s(1-G_i^2)}.$$

19. The multistage matching network of claim 16 wherein the at least one capacitor and the at least one inductor have capacitance or inductance values determined by the following:

$$C = \frac{1-\frac{1}{G_i^2}}{2\pi f_s\left(\sqrt{(G_i^2-1)+G_i^2 Q_{in}^2} + Q_{in}\right)R_{load}},$$

and $$L = \frac{\left(\sqrt{(G_i^2-1)+G_i^2 Q_{in}^2} - Q_{load}\right)R_{load}}{2\pi f_s}.$$

20. The multistage matching network of claim 16 wherein the at least one capacitor and the at least one inductor have capacitance or inductance values determined by the following:

$$C = \frac{1}{2\pi f_s\left(\sqrt{(G_i^2-1)+G_i^2 Q_{in}^2} + Q_{load}\right)R_{load}},$$

and $$L = \frac{\left(\sqrt{(G_i^2-1)+G_i^2 Q_{in}^2} - Q_{in}\right)R_{load}}{2\pi f_s\left(1-\frac{1}{G_i^2}\right)}.$$

* * * * *